(12) United States Patent
Kubouchi

(10) Patent No.: US 11,355,595 B2
(45) Date of Patent: Jun. 7, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Motoyoshi Kubouchi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 17/139,130

(22) Filed: Dec. 31, 2020

(65) Prior Publication Data

US 2021/0126092 A1  Apr. 29, 2021

Related U.S. Application Data

(63) Continuation of application No. PCT/JP2020/001228, filed on Jan. 16, 2020.

(30) Foreign Application Priority Data

Jan. 18, 2019  (JP) ............................. JP2019-007329

(51) Int. Cl.
*H01L 29/32* (2006.01)
*H01L 21/265* (2006.01)
(Continued)

(52) U.S. Cl.
CPC ............ *H01L 29/32* (2013.01); *H01L 21/265* (2013.01); *H01L 21/324* (2013.01);
(Continued)

(58) Field of Classification Search
CPC . H01L 27/0761; H01L 29/7397; H01L 29/32; H01L 29/36; H01L 21/265; H01L 21/324
See application file for complete search history.

(56) References Cited

U.S. PATENT DOCUMENTS

2005/0116249 A1  6/2005  Mauder et al.
2007/0231973 A1  10/2007  Ruething et al.
(Continued)

FOREIGN PATENT DOCUMENTS

CN    107924951 A  *  4/2018 ............ H01L 21/76
JP    2014063961 A     4/2014
(Continued)

OTHER PUBLICATIONS

International Search Report for PCT/JP2020/001228, dated Mar. 24, 2020.
(Continued)

*Primary Examiner* — Joseph C. Nicely
(74) *Attorney, Agent, or Firm* — Rabin & Berdo, P.C.

(57) ABSTRACT

Directly beneath p⁻-type base regions, n-type storage regions are provided. The storage regions contain hydrogen donors as an impurity and have an impurity concentration higher than that of the n⁻-type drift region. The storage regions are formed by hydrogen ion irradiation from a back surface of a semiconductor substrate. The storage regions have a peak hydrogen concentration and are at positions that coincide with where the hydrogen ions have been irradiated. By the hydrogen ion irradiation, a crystal defect region that is a carrier lifetime killer region is formed concurrently with the storage regions, closer to the back surface of the semiconductor substrate than are storage regions. The crystal defect region has a crystal defect density with a peak density at a position closer to the back surface of the semiconductor substrate than are the storage regions. A semiconductor device having such storage regions and a carrier lifetime killer region is enabled.

33 Claims, 12 Drawing Sheets

(51) Int. Cl.
    *H01L 21/324*     (2006.01)
    *H01L 27/07*     (2006.01)
    *H01L 29/36*     (2006.01)
    *H01L 29/739*     (2006.01)

(52) U.S. Cl.
    CPC .......... *H01L 27/0761* (2013.01); *H01L 29/36* (2013.01); *H01L 29/7397* (2013.01)

(56) References Cited

U.S. PATENT DOCUMENTS

| | | | |
|---|---|---|---|
| 2007/0278514 | A1 | 12/2007 | Schulze et al. |
| 2008/0315364 | A1 | 12/2008 | Nemoto |
| 2009/0184338 | A1* | 7/2009 | Hisamoto ......... H01L 29/66333 |
| | | | 257/139 |
| 2009/0224284 | A1 | 9/2009 | Nemoto |
| 2013/0341674 | A1 | 12/2013 | Werber et al. |
| 2014/0117502 | A1 | 5/2014 | Laven et al. |
| 2014/0217463 | A1 | 8/2014 | Schulze et al. |
| 2014/0246755 | A1 | 9/2014 | Yoshimura et al. |
| 2014/0291723 | A1 | 10/2014 | Miyazaki et al. |
| 2015/0050798 | A1* | 2/2015 | Kobayashi ............ H01L 29/36 |
| | | | 438/475 |
| 2015/0311279 | A1* | 10/2015 | Onozawa ......... H01L 29/66348 |
| | | | 257/139 |
| 2016/0276446 | A1* | 9/2016 | Wakimoto .......... H01L 29/7397 |
| 2017/0222029 | A1 | 8/2017 | Kono |
| 2017/0271447 | A1 | 9/2017 | Tamura et al. |
| 2017/0373141 | A1 | 12/2017 | Yoshida et al. |
| 2018/0269063 | A1 | 9/2018 | Kodama |
| 2018/0350962 | A1 | 12/2018 | Naito |
| 2019/0139772 | A1 | 5/2019 | Kodama |
| 2020/0135847 | A1* | 4/2020 | Kiyoi ..................... H01L 29/78 |
| 2021/0384330 | A1* | 12/2021 | Yoshikawa .......... H01L 21/265 |

FOREIGN PATENT DOCUMENTS

| | | | | |
|---|---|---|---|---|
| JP | 2017-011000 | A | | 1/2017 |
| JP | 2017-135339 | A | | 8/2017 |
| JP | 6272799 | B2 | | 1/2018 |
| JP | 2018-137454 | A | | 8/2018 |
| JP | 2018137454 | A | * | 8/2018 ......... H01L 27/0664 |
| JP | 2018-157017 | A | | 10/2018 |
| WO | 2018/030444 | A1 | | 2/2018 |
| WO | WO-2018030444 | A1 | * | 2/2018 ........... H01L 21/263 |

OTHER PUBLICATIONS

Office Action of Japanese Patent Application No. 2020-566470 dated Feb. 8, 2022.

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2020/001228 filed on Jan. 16, 2020 which claims priority from a Japanese Patent Application No. 2019-007329 filed on Jan. 18, 2019, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, in semiconductor devices such as insulated gate bipolar transistors (IGBTs), a structure in which a storage region that accumulates charge that becomes minority carriers when the IGBT is ON is included between a base region and a drift region is commonly known. In an instance of an n-channel-type IGBT, the minority carriers are holes (positive holes) while the storage region is an n-type region having a same conductivity type as that of an $n^-$-type drift region and an impurity concentration higher than that of the $n^-$-type drift region.

Further, an IGBT that includes a storage region containing hydrogen (H) atoms as an impurity and carrier lifetime killer region disposed closer to a collector than is the storage region has been proposed (for example, refer to International Publication No. WO 2018/030444). In International Publication No. WO 2018/030444, the storage region is formed by proton ($H^+$) implantation and the carrier lifetime killer region is formed by electron beam irradiation. Further, a method of forming a carrier lifetime killer region light ion irradiation (for example, refer to Japanese Patent No. 6272799) or (He) beam irradiation (for example, refer to Japanese Laid-Open Patent Publication No. 2017-135339) have been proposed.

SUMMARY OF THE INVENTION

According to an embodiment of the invention, a semiconductor device includes a semiconductor substrate having a front surface and a back surface opposite to each other: a plurality of hydrogen donors provided in the semiconductor substrate and having a first doping concentration higher than a second doping concentration of a dopant of the semiconductor substrate, the hydrogen donors having a doping concentration distribution that has a peak at a first depth position apart from the front surface of the semiconductor substrate by a predetermined distance in a depth direction of the semiconductor substrate and a tail where the first doping concentration is lower than at the peak, a position of the tail being closer to the back surface of the semiconductor substrate than is the first depth position; and a crystal defect region containing crystal defects, the crystal defect region having a second depth position where a density of the crystal defects toward the front surface of the semiconductor substrate in the depth direction is greatest, the second depth position being closer to the back surface of the semiconductor substrate in the depth direction of the semiconductor substrate than is the first depth position.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
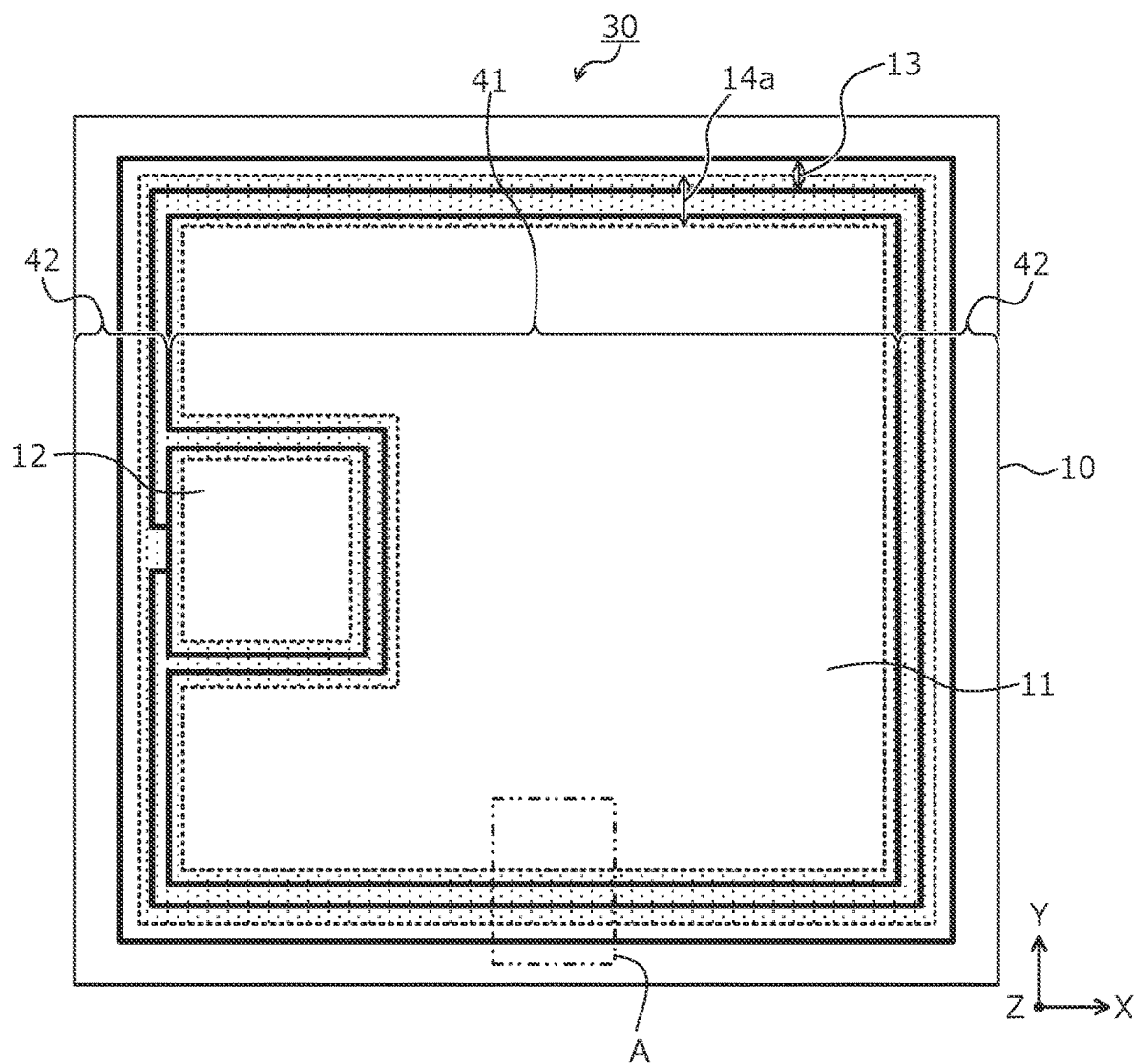
FIG. 1 is a plan view of a semiconductor device according to a first embodiment when viewed from a front side of a semiconductor substrate.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 2:
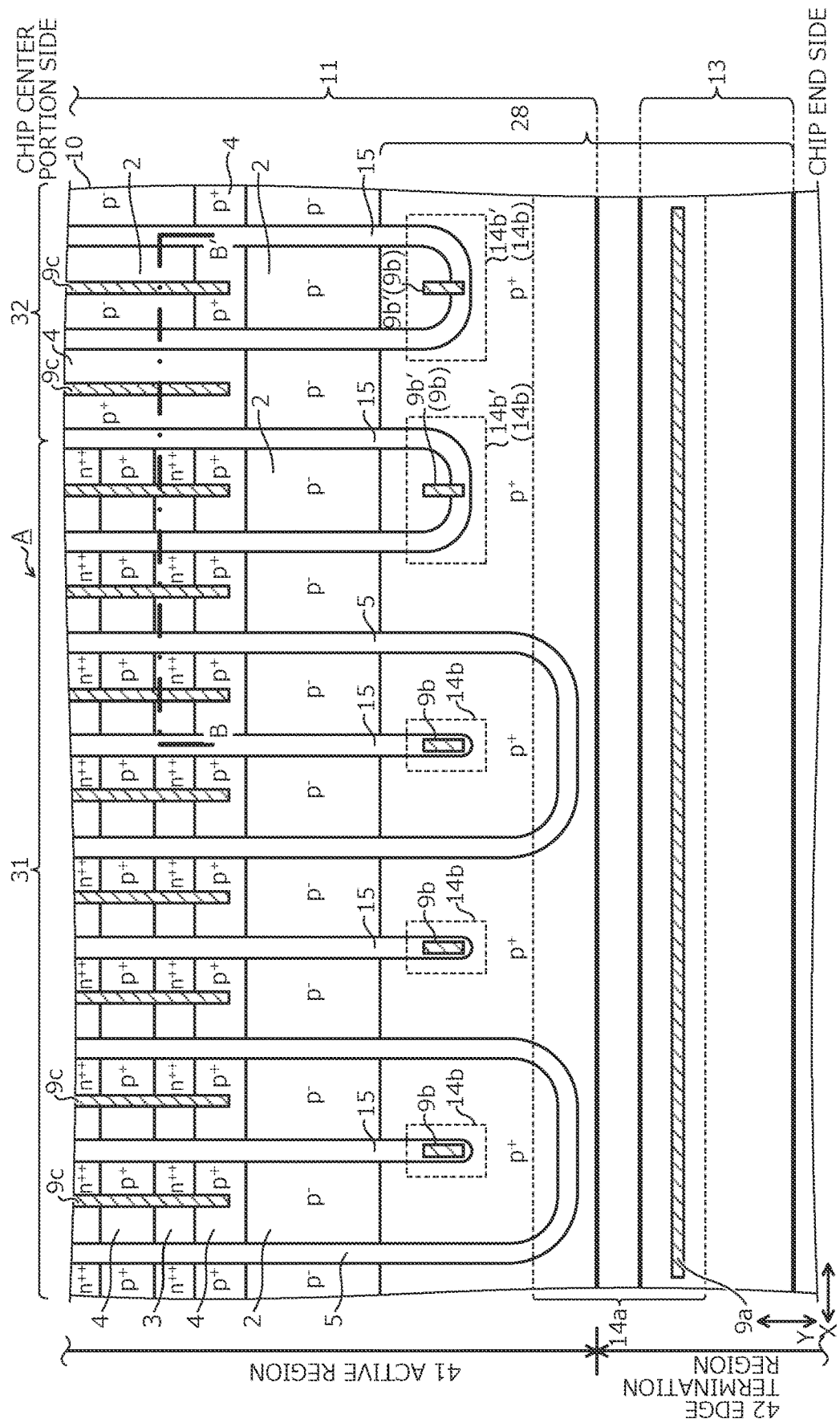
FIG. 2 is an enlarged plan view of a portion of Fig.

A structure of a semiconductor device according to a first embodiment is described taking, as an example, a reverse conducting IGBT (RC-IGBT). FIG. 1 is a plan view of the semiconductor device according to the first embodiment when viewed from a front side of a semiconductor substrate. FIG. 2 is an enlarged plan view of a portion of Fig. FIG. 2 depicts a portion A of a semiconductor substrate (semiconductor chip) 10, near a border between an active region 41 and an edge termination region 42.

The active region 41 is a region through which a main current passes when a semiconductor device 30 is in an ON state under switching control. The active region 41, for example, has a substantially rectangular shape in a plan view thereof and is disposed in substantially a center of the semiconductor substrate 10. Between ends of the active region 41 and ends of the semiconductor substrate 10, the edge termination region 42 may be provided so as to surround a periphery of the active region 41. FIG. 1 depicts an instance in which the edge termination region 42 is provided in the semiconductor substrate 10.

The edge termination region 42 is a region that mitigates electric field of a front side of the semiconductor substrate 10. In the edge termination region 42, a field limiting ring (FLR), a field plate, and a RESURF, or a voltage withstanding structure combining these is disposed. A breakdown voltage is an upper limit voltage at which no erroneous operation or destruction of the semiconductor device 30 occurs.

The semiconductor device 30 according to the first embodiment and depicted in FIGS. 1 and 2 is a RC-IGBT that includes, in the active region 41 of the semiconductor substrate 10, an IGBT region 31 in which an IGBT is provided and a freewheeling diode (FWD) region in which a FWD region 32 connected in parallel to the IGBT is provided. The IGBT region 31 and the FWD region 32 are adjacent to one another along a direction (hereinafter, first direction) X parallel to a front surface of the semiconductor substrate 10.

In the IGBT region 31, $p^-$-type base regions (second semiconductor regions) 2, $n^{++}$-type emitter regions (fifth semiconductor regions) 3, $p^+$-type contact regions 4, and gate trench portions 5 configuring the IGBT are provided in the semiconductor substrate 10, on the front side thereof. The gate trench portions 5 have a trench gate structure configured by trenches (hereinafter, gate trenches) 6, gate insulating films 7, and gate electrodes (third electrodes) 8 (refer to FIG. 3). Further, in the semiconductor substrate 10, on the front side thereof, dummy trench portions 15 having a trench gate structure similar to the trench gate structure of the gate trench portions 5 are provided.

The dummy trench portions 15 have a dummy trench gate structure configured by trenches (hereinafter, dummy trenches) 16, gate insulating films (hereinafter, dummy gate insulating films) 17, and gate electrodes (hereinafter, dummy gate electrodes (third electrodes) 18 (refer to FIG. 3). The dummy trench portions 15 may have a dummy trench gate structure similar to the trench gate structure of the gate trench portions 5. In this instance, the dummy trenches 16, the dummy gate insulating films 17 and the dummy gate electrodes 18 of the dummy trench portions 15, for example, are respectively formed by processes that are a same as those for the gate trenches 6, the gate insulating films 7, and the gate electrodes 8 of the gate trench portions 5.

The gate trenches 6 and the dummy trenches 16 are disposed in the IGBT region 31, repeatedly alternating one another in the first direction X and, for example, closest to the FWD region 32 in the first direction X, one of the dummy trenches 16 is disposed. The gate trenches 6 and the dummy trenches 16 are provided in a stripe pattern extending in a direction (hereinafter, second direction (longitudinal direction)) Y parallel to the front surface of the semiconductor substrate 10 and orthogonal to the first direction X.

The gate trenches 6 and the dummy trenches 16 extend from the active region 41 outward (toward ends of the semiconductor substrate 10 (chip ends)) in the second direction Y and terminate in a later-described $p^+$-type well region 28. The gate trenches 6 terminate closer to the chip ends in the second direction Y than do the dummy trenches 16. The gate trenches 6 may form a U-shape or ring-shape in which adjacent ends (ends in the longitudinal direction) of pairs of the gate trenches 6 adjacent to each other in the first direction X are connected to each other.

In an instance in which the ends of the gate trenches 6 are connected, connection portions between the gate trenches 6 may have a linear portion parallel to the first direction X or may have a curved portion curved to protrude toward the chip ends in the second direction Y. Of the dummy trenches 16, a dummy trench 16 disposed closest to the FWD region 32 in the first direction X and of the dummy trenches 16 in the FWD region 32, a dummy trench 16 adjacent thereto in the first direction X may form a U-shape or a ring-shape in which respective ends thereof adjacent to one another in the first direction X are connected.

The $p^-$-type base regions 2, the $n^{++}$-type emitter regions 3, and the $p^+$-type contact regions 4 are provided in each mesa region between one of the gate trenches 6 and the dummy trenches 16 adjacent thereto in the first direction X. Further, similarly to the other mesa regions, in the mesa region between the dummy trenches 16 and closest to the FWD region 32 in the first direction X, the $p^-$-type base regions 2, the $n^{++}$-type emitter regions 3, and the $p^+$-type contact regions 4 are provided.

The $p^-$-type base regions 2, the $n^{++}$-type emitter regions 3, and the $p^+$-type contact regions 4 extend in the mesa regions along the first direction X and reach the gate trenches 6 and the dummy trenches 16 adjacent thereto along the first direction X. The $p^-$-type base regions 2 extend closer to the chip ends in the second direction Y than do the $n^{++}$-type emitter regions 3 and the $p^+$-type contact regions 4. The extended portions of the $p^-$-type base regions 2 are exposed at the front surface of the semiconductor substrate 10 (refer to FIG. 3). The portions of the $p^-$-type base regions 2 exposed at the front surface of the semiconductor substrate 10 surround a periphery of a region in which the IGBT region 31 and the FWD region 32 are disposed.

The $p^-$-type base regions 2 terminate closer to a center portion (chip center) of the semiconductor substrate 10 in the second direction Y than do the dummy trenches 16. The $n^{++}$-type emitter regions 3 and the $p^+$-type contact regions 4 are disposed to be adjacent to and repeatedly alternate one another in the second direction Y so that, thereamong, the $p^+$-type contact regions 4 are disposed closest to the chip ends in the second direction Y. The $p^+$-type contact regions 4 disposed closest to the chip ends in the second direction Y, for example, surround ends of later described contact holes 9c in the second direction Y.

In the FWD region 32, the dummy trench portions 15 are provided in the semiconductor substrate 10, on the front side thereof. The dummy trench portions 15 of the FWD region 32, similarly to the dummy trench portions 15 of the IGBT region 31, are configured by the dummy trenches 16, the dummy gate insulating films 17, and the dummy gate electrodes 18, are disposed in a stripe pattern extending in the second direction Y, and are adjacent to the dummy trench portions 15 of the IGBT region 31, in the first direction X.

The dummy trenches 16 may form a U-shape or a ring-shape in which adjacent ends of pairs of the dummy trenches 16 adjacent to each other in the first direction X are connected to each other. A pitch (arrangement interval) of the dummy trenches 16 of the FWD region 32 is substantially equal to a repeat pitch of the gate trenches 6 and the dummy trenches 16 in the IGBT region 31. In mesa regions between adjacent dummy trenches 16 of the dummy trenches 16 in the FWD region 32, the p⁻-type base regions 2 are disposed.

In the FWD region 32, the p⁻-type base regions 2 function as p⁻-type anode regions of the FWD. The p⁻-type base regions 2 are exposed at the front surface of the semiconductor substrate 10, in substantially an entire area of the mesa regions (refer to FIG. 3). The p⁻-type base regions 2 extend in the mesa regions along the first direction X and reach the dummy trenches 16 adjacent thereto in the first direction X. The FWD region 32 is free of the n⁺⁺-type emitter regions 3 and the gate trench portions 5.

In the FWD region 32, the p⁺-type contact regions 4 may be provided. In this instance, for example, the p⁺-type contact regions 4 may be selectively provided at positions surrounding the ends of the later-described contact holes 9c, in the second direction Y. Further, in the FWD region 32, in substantially an entire area of the mesa region closest to the IGBT region 31, the p⁺-type contact regions 4 may extend in a linear shape in the second direction Y so as to be provided on the front surface of the semiconductor substrate 10.

Further, in the active region 41, on the front surface of the semiconductor substrate 10, the p⁺-type well region 28 is provided closer to the chip ends than are the p⁻-type base regions 2 in the second direction Y and in contact with the p⁻-type base regions 2. The p⁺-type well region 28 surrounds a periphery of portions of the p⁻-type base regions 2 exposed at the front surface of the semiconductor substrate 10. The p⁺-type well region 28 extends from the active region 41 to the edge termination region 42.

On the front surface of the semiconductor substrate 10, a gate runner 14a and conductive layers 14b are provided apart from one another, via a field oxide film (not depicted). The gate runner 14a and the conductive layers 14b face the p⁺-type well region 28 in a depth direction Z. The gate runner 14a and the conductive layers 14b, for example, contain a conductive material such as a polysilicon (poly-Si) doped with an n-type or p-type impurity.

The gate runner 14a is provided in the edge termination region 42 near a border between the edge termination region 42 and the active region 41, the gate runner 14a extending from the edge termination region 42 to the active region 41 and surrounding a later-described emitter electrode (first electrode) 11 and a periphery of a gate pad 12. The gate runner 14a, in the depth direction Z, faces an outer peripheral portion of the emitter electrode 11, an outer peripheral portion of the gate pad 12, and an inner peripheral portion of a gate wiring layer 13, with an interlayer insulating film 9 intervening therebetween (refer to FIG. 3).

Further, the gate runner 14a covers the ends of the gate trenches 6 in the second direction Y or the connection portions thereof. The gate runner 14a is in contact with the gate electrodes 8 of the gate trench portions 5, at the ends of the gate trenches 6 in the second direction Y or the connection portions thereof. All of the gate electrodes 8 of the gate trench portions 5 are connected to the gate runner 14a. The dummy gate electrodes 18 of the dummy trench portions 15 are not connected to the gate runner 14a.

The conductive layers 14b are provided in plural, separate from one another in the active region 41. The conductive layers 14b cover different ends of the dummy trenches 16 in the second direction Y, respectively. Entire areas of the connection portions of the ends of the dummy trenches 16 in the second direction Y may be covered by conductive layers 14b' (14b). The conductive layers 14b are in contact with the dummy gate electrodes 18, at the ends of the dummy trenches 16 in the second direction Y or the connection portions thereof.

A potential other than gate potential is applied to the dummy gate electrodes 18 via the conductive layers 14b. Herein, an instance in which emitter potential is applied to the dummy gate electrodes 18 is described as an example. The gate electrodes 8, the dummy gate electrodes 18, the gate runner 14a, and the conductive layers 14b are covered by the interlayer insulating film 9. On the interlayer insulating film 9, the emitter electrode 11, the gate pad 12, and the gate wiring layer 13 of the IGBT of the IGBT region 31 are disposed apart from one another.

The emitter electrode 11, in the active region 41, covers substantially an entire area of a region excluding a region in which the gate pad 12 is disposed. In particular, the emitter electrode 11, for example, may form a substantially rectangular shape having, in a plan view thereof, a recessed portion recessed toward the chip center (center portion of the semiconductor substrate 10). An area from a center portion of the active region 41 to an inner periphery portion of the p⁺-type well region 28 is covered by the emitter electrode 11, in the depth direction Z, with the interlayer insulating film 9 intervening therebetween.

The emitter electrode 11 is in contact with the n⁺⁺-type emitter regions 3 and the p⁺-type contact regions 4 of the IGBT region 31, via the contact holes 9c. Further, the emitter electrode 11 doubles as an anode electrode of the FWD and is in contact with the p⁻-type base regions 2 and the p⁺-type contact regions 4 of the FWD region 32, via the contact holes 9c. Further, the emitter electrode 11 is in contact with the conductive layers 14b, via contact holes 9b.

All of the dummy gate electrodes 18 are electrically connected to the emitter electrode 11, via the conductive layers 14b. Further, the emitter electrode 11 functions as an emitter pad. In an instance in which p⁺-type contact regions (not depicted) having an impurity concentration higher than an impurity concentration of the p⁺-type contact regions 4 are disposed in surface regions of the p⁺-type contact regions 4, the emitter electrode 11 is further in contact with the p⁺⁺-type contact regions, via the contact holes 9c. In the present embodiment, while the dummy gate electrodes 18 and the emitter electrode 11 are electrically connected, configuration may be such that the dummy gate electrodes 18 and the emitter electrode 11 are not connected.

The gate pad 12 has a substantially rectangular shape in a plan view thereof. The gate pad 12, in the active region 41, is disposed in the recessed portion of the emitter electrode 11, and three edges of the gate pad 12 are surrounded by the emitter electrode 11. The gate pad 12, at a remaining edge thereof, is connected to the gate wiring layer 13. The gate wiring layer 13 is disposed in the edge termination region 42, separate from the emitter electrode 11; the gate wiring layer 13 surrounds a periphery of the active region 41.

Further, the gate wiring layer 13 covers an outer peripheral portion of the p⁺-type well region 28 in the depth direction Z with the interlayer insulating film 9 intervening therebetween. The emitter electrode 11, the gate pad 12, and the gate wiring layer 13, for example, are formed by patterning and dividing a single electrode layer containing a metal. In the emitter electrode 11, the gate pad 12, and the gate wiring layer 13, for example, a region of a portion is aluminum (Al) or an aluminum-silicon (Al—Si) alloy.

In particular, the emitter electrode 11, the gate pad 12, and the gate wiring layer 13, for example, may have a stacked structure having a barrier metal containing a titanium compound such as titanium (Ti) or titanium nitride (TiN) and an electrode layer containing aluminum stacked on the barrier metal. Further, the emitter electrode 11 and the gate wiring layer 13, for example, may have a structure having a contact plug formed by embedding a highly embeddable metal such as tungsten (W) in the contact holes 9c, 9a, via the barrier metal.

In FIGS. 1 and 2, the emitter electrode 11, the gate pad 12, and the gate wiring layer 13 are indicated by bold lines, and the gate runner 14a and the conductive layers 14b are indicated by a dotted line. In FIG. 2, hatched regions indicated by reference characters 9a, 9b, 9b', and 9c are contact holes of the interlayer insulating film 9. In the contact hole 9a, a contact (electrical contact) between the gate wiring layer 13 and the gate runner 14a is formed. The contact hole 9a is provided along the gate wiring layer 13 and surrounds a periphery of the active region 41.

In the contact holes 9b, a contact between the conductive layers 14b and the emitter electrode 11 is formed. When the conductive layers 14b' (14b) cover the connection portions of the dummy trenches 16, in the contact holes 9b' (9b), a contact connecting the conductive layers 14b' and the p$^+$-type well region 28 with the emitter electrode 11 may be formed. The contact holes 9b, for example, have a substantially rectangular shape in a plan view thereof. In the contact holes 9c of the mesa regions, a contact between the semiconductor substrate 10 and the emitter electrode 11 is formed. The contact holes 9c, for example, have a same length and extend in a linear shape in the second direction Y.

In the contact holes 9c of the IGBT region 31, the n$^{++}$-type emitter regions 3 and the p$^+$-type contact regions 4 are exposed. In the contact holes 9c of the IGBT region 31, the p$^-$-type base regions 2 and the p$^+$-type well region 28 are not exposed. The emitter electrode 11, via the contact holes 9c of the IGBT region 31, is in contact with the n$^{++}$-type emitter regions 3 and the p$^+$-type contact regions 4 and is electrically connected to the p$^-$-type base regions 2, the p$^+$-type well region 28, the n$^{++}$-type emitter regions 3, and the p$^+$-type contact regions 4.

In the contact holes 9c of the FWD region 32, the p$^-$-type base regions 2 and the p$^+$-type contact regions 4 are exposed. In the contact holes 9c of the FWD region 32, the p$^+$-type well region 28 is not exposed. The emitter electrode 11, via the contact holes 9c of the FWD region 32, is in contact with the p$^-$-type base regions 2 and the p$^+$-type contact regions 4 and is electrically connected to the p$^-$-type base regions 2, the p$^+$-type well region 28, the p$^-$-type base regions 2, and the p$^+$-type contact regions 4.

Next, a cross-section of the structure of the semiconductor device 30 according to the first embodiment is described. FIG. 3 is a cross-sectional view of the structure along cutting line B-B' in FIG. 2. FIG. 3 depicts a cross-section of the n$^{++}$-type emitter regions 3 of the IGBT region 31, parallel to the first direction X.

Figure 3:
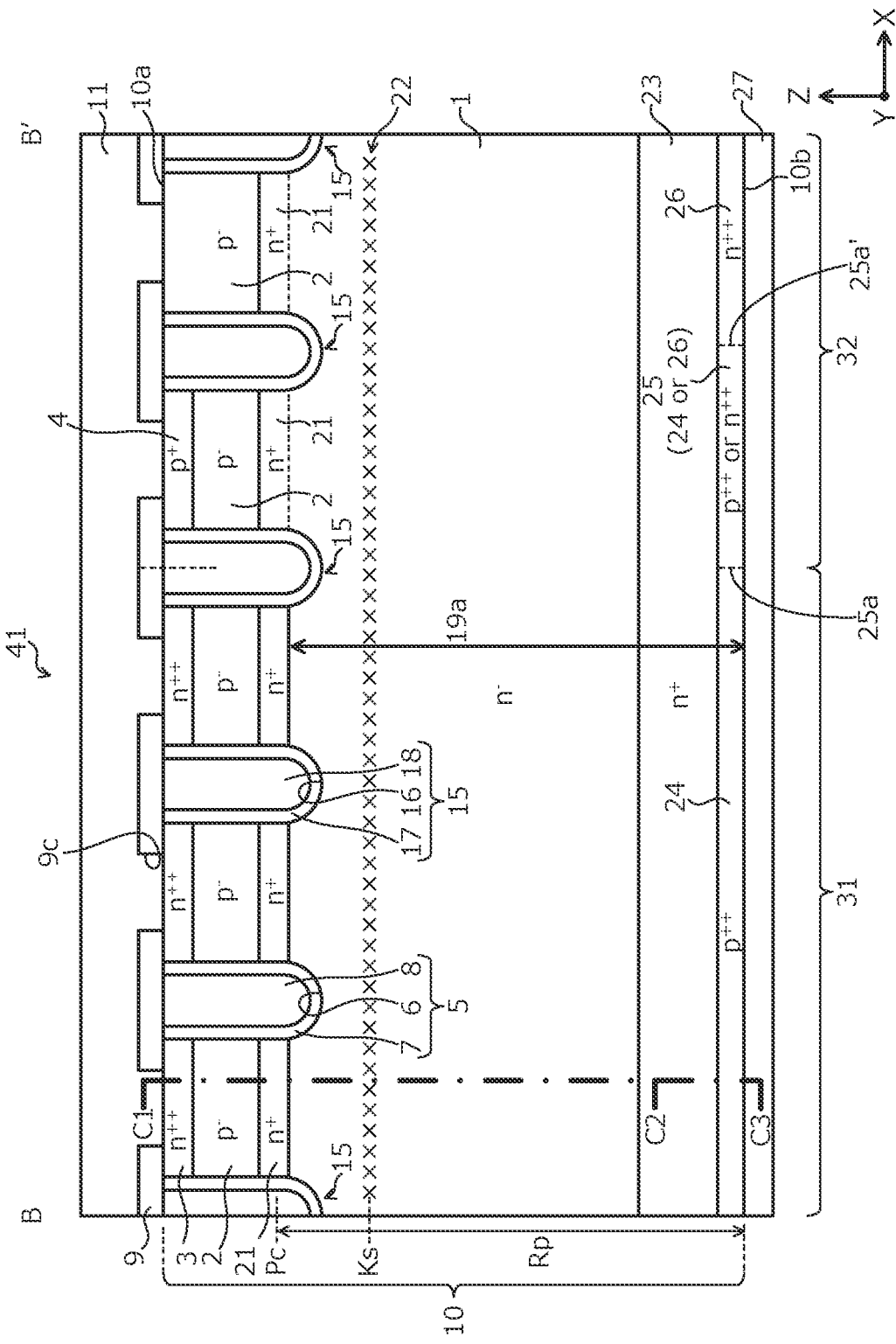
FIG. 3 is a cross-sectional view of a structure along cutting line B-B' in FIG. 2.

As depicted in FIG. 3, in the IGBT region 31 of the active region 41, as described above, the p$^-$-type base regions 2, the n$^{++}$-type emitter regions 3, the p$^+$-type contact regions 4 (refer to FIG. 2) and the gate trench portions 5 configuring the IGBT, and the dummy trench portions 15 and the p$^+$-type well region 28 (refer to FIG. 2) are provided in the semiconductor substrate 10, at a front surface 10a thereof. In the FWD region 32 of the active region 41, as described above, the p$^-$-type base regions 2 and the dummy trench portions 15 configuring the FWD are provided in the semiconductor substrate 10, at a front surface 10a thereof.

The p$^-$-type base regions 2 are provided in a surface layer of the semiconductor substrate 10, at a front surface 10a thereof, spanning an entire area of the active region 41. The p$^-$-type base regions 2 of the FWD region 32 may have an impurity concentration that is lower than an impurity concentration of the p$^-$-type base regions 2 of the IGBT region 31. For example, the impurity concentration of the p$^-$-type base regions 2 of the IGBT region 31 has a peak value (maximum value) of about $3.5 \times 10^{19}$/cm$^3$, for example, at a depth about 0.3 μm from the front surface 10a of the semiconductor substrate 10, and the p$^-$-type base regions 2 of the IGBT region 31 reach a depth of about 1.8 μm from the front surface 10a of the semiconductor substrate 10.

The impurity concentration of the p$^-$-type base regions 2 of the IGBT region 31, near centers of the mesa regions in the first direction X at a depth that is shallow from the front surface 10a of the semiconductor substrate 10 and may be higher than that near the trenches. The impurity concentration of the p$^-$-type base regions 2 of the FWD region 32 has a peak value in a range from $7 \times 10^{16}$/cm$^3$ to $3 \times 10^{17}$/cm$^3$, for example, at a depth of about 0.3 μm from the front surface 10a of the semiconductor substrate 10 and the p$^-$-type base regions 2 of the FWD region 32 reach a depth of about 1.8 μm from the front surface 10a of the semiconductor substrate 10.

An n$^-$-type drift region (first semiconductor region) 1 is provided at a position deeper from the front surface 10a of the semiconductor substrate 10 than are the p$^-$-type base regions 2. While not depicted, the n$^-$-type drift region 1 extends from the active region 41 to ends (side surfaces) of the semiconductor substrate 10 and is exposed at the front surface 10a of the semiconductor substrate 10, closer to the chip ends than is the p$^+$-type well region 28. The voltage withstanding structure is disposed in a portion of the n$^-$-type drift region 1, closer to the chip ends than is the p$^+$-type well region 28.

The n$^{++}$-type emitter regions 3 and the p$^+$-type contact regions 4 are selectively provided in the IGBT region 31, between the front surface 10a of the semiconductor substrate 10 and the p$^-$-type base regions 2 to be in contact with the p$^-$-type base regions 2. The n$^{++}$-type emitter regions 3 and the p$^+$-type contact regions 4 are exposed at the front surface 10a of the semiconductor substrate 10.

The n$^{++}$-type emitter regions 3 and the p$^+$-type contact regions 4, for example, have equal diffusion depths from the front surface 10a of the semiconductor substrate 10.

The p$^+$-type contact regions 4 may be selectively provided in the FWD region 32, between the front surface 10a of the semiconductor substrate 10 and the p$^-$-type base regions 2. A diffusion depth of the p$^+$-type well region 28 may be deeper than depths of the gate trenches 6 and the dummy trenches 16, and portions of bottoms of the gate trenches 6 and the dummy trenches 16 may be surrounded by the p$^+$-type well region 28. Entire areas of bottoms of ends of the dummy trenches 16 in the second direction Y may be surrounded by the p$^+$-type well region 28.

The gate trench portions 5, as described above, are configured by the gate trenches 6, the gate insulating films 7, and the gate electrodes 8. The dummy trench portions 15, as described above, are configured by the dummy trenches 16, the dummy gate insulating films 17, and the dummy gate electrodes 18. The gate trenches 6 and the dummy trenches 16 penetrate the n$^{++}$-type emitter regions 3, the p$^+$-type contact regions 4 and the p$^-$-type base regions 2 from the front surface 10a of the semiconductor substrate 10 and reach the n$^-$-type drift region 1.

All of the trenches (the gate trenches 6 and the dummy trenches 16) disposed in the active region 41 may have a same depth. All of the trenches disposed in the active region 41 may be disposed at a same pitch (interval). The gate insulating films 7, for example, may be formed by oxidizing or nitriding the semiconductor exposed at inner walls of the gate trenches 6. The gate electrodes 8 are provided in the gate trenches 6, via the gate insulating films 7.

The gate electrodes 8, for example, are formed using a conductive material such as a polysilicon to which an n-type or a p-type impurity is added. When voltage at least equal to a gate threshold voltage is applied to the gate electrodes 8, in portions of the p$^-$-type base regions 2 along the gate trenches 6, channels (n-type inversion layer) are formed. The dummy gate electrodes 18 are provided in the dummy trenches 16, via the dummy gate insulating films 17. The dummy gate electrodes 18 may be formed using a same material as that of the gate electrodes 8.

In the mesa regions of the IGBT region 31, storage regions 21 of an n-type and having an impurity concentration higher than an impurity concentration of the n$^-$-type drift region 1 are provided directly beneath the p$^-$-type base regions 2. Directly beneath the p$^-$-type base regions 2 means in the n$^-$-type drift region 1, near borders thereof with the p$^-$-type base regions 2.

The storage regions 21 may extend in the mesa regions in the first direction X, and reach the trenches (the gate trenches 6 and the dummy trenches 16) adjacent thereto in the first direction X. By the storage regions 21 reaching the trenches adjacent to the mesa regions in the first direction X, between the trenches adjacent in the first direction X is blocked by the storage regions 21, whereby a portion of the n$^-$-type drift region 1 closer to a collector side than are the bottoms of the trenches and the mesa regions are separate from one another. In this instance, the storage regions 21 may reach positions deeper than the bottoms of the gate trenches 6 and the dummy trenches 16 from the mesa region. The storage regions 21 may be in contact with the p$^-$-type base regions 2. FIG. 3 depicts an instance in which the storage regions 21 are in contact with the p$^-$-type base regions 2.

Further, the storage regions 21 contain a greater amount of hydrogen atoms as an impurity than other regions in the semiconductor substrate 10. The hydrogen atoms in the storage regions 21 are introduced into the semiconductor substrate 10 by hydrogen ion irradiation and are converted to donors (hereinafter, hydrogen donors) by an annealing process (hereinafter, donor treatment). In other words, the storage regions 21 contain hydrogen donors. The storage regions 21, as hydrogen donors, suffice to contain VOH composite defects to which at least one cluster each of hydrogen (H), oxygen (O), and vacancies (V) are bonded.

The storage regions 21, due to hydrogen donors, have an n-type impurity concentration that is higher than that of the n$^-$-type drift region 1. The hydrogen ion irradiation for forming the storage regions 21 may be irradiation of protons (proton, H$^+$), deuterons (D$^+$), or triton (T$^+$) from a back surface 10b of the semiconductor substrate 10 into the n$^-$-type drift region 1. Herein, an instance in which the storage regions 21 are formed by proton irradiation is described as an example.

The storage regions 21 have a function of accumulating directly beneath the p$^-$-type base regions 2, charge (holes (positive holes)) that becomes minority carriers when the IGBT of the IGBT region 31 is ON. Therefore, by providing the storage regions 21 in the IGBT region 31, an injection enhancement (IE) effect may be increased and ON resistance of the IGBT of the IGBT region 31 may be reduced. The storage regions 21, in a thickness direction thereof (direction parallel to the depth direction Z), may face all of the p$^-$-type base regions 2.

In the mesa regions of the FWD region 32, the storage regions 21 may be provided directly beneath the p$^-$-type base regions 2, similarly to the IGBT region 31. By providing the storage regions 21 in the FWD region 32, during forward bias of the FWD configured by pn junctions between the p$^-$-type base regions 2 and the storage regions 21, the n$^-$-type drift region 1, and later described n$^{++}$-type cathode region 26 of the FWD region 32, over injection of minority carriers (positive holes) from the p$^-$-type base regions 2 to the n$^-$-type drift region 1 may be suppressed.

Figure 4:
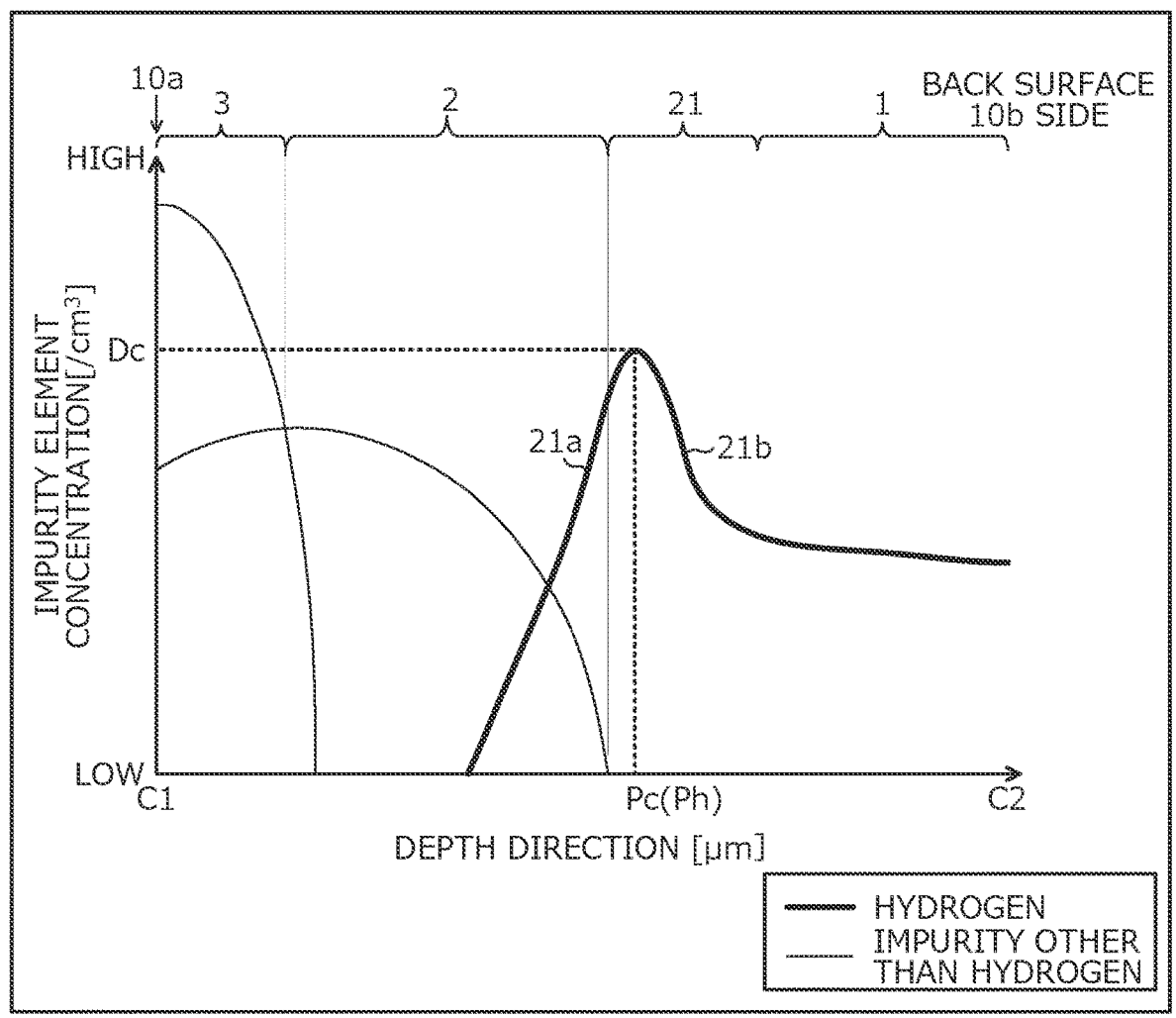
FIG. 4 is a characteristics diagram depicting concentration distribution along cutting line C1-C2 in FIG. 3.

Distribution of impurity elements contained in the n$^{++}$-type emitter regions 3, the p$^-$-type base regions 2, and the storage regions 21 is described using FIG. 4. FIG. 4 is a characteristics diagram depicting concentration distribution along cutting line C1-C2 in FIG. 3. FIG. 4 shows concentration distribution of impurity elements in the depth direction Z from the front surface 10a of the semiconductor substrate 10, in the IGBT region 31 in an instance in which the storage regions 21 are formed by the hydrogen ion irradiation from the back surface 10b of the semiconductor substrate 10. FIG. 4 depicts concentration distribution of impurity elements that have not been activated.

In the n$^{++}$-type emitter regions 3, an n-type impurity element and an impurity element forming the p$^-$-type base regions 2 are distributed in the depth direction Z from the front surface 10a of the semiconductor substrate 10. Impurity elements respectively forming the n$^{++}$-type emitter regions 3 and the p$^-$-type base regions 2 are ion implanted from the front surface 10a side of the semiconductor substrate 10, whereby impurity element concentration distributions like those depicted are obtained. Further, from the front surface 10a of the semiconductor substrate 10 to regions having a large amount of an activated n-type impurity element form the n$^{++}$-type emitter regions 3. In other words, the n$^{++}$-type emitter regions 3 are from the front surface 10a of the semiconductor substrate 10, to a border between an n-type impurity element concentration distribution of the n$^{++}$-type emitter regions 3 and a p-type impurity element concentration distribution of the p$^-$-type base regions 2.

In regions deeper from the front surface 10a of the semiconductor substrate 10 than are the n$^{++}$-type emitter regions 3, to regions having a large amount of an activated p-type impurity element form the p$^-$-type base regions 2. In other words, the p$^-$-type base regions 2 are from a border between n-type impurity element concentration distribution of the n$^{++}$-type emitter regions 3 and p-type impurity element concentration distribution of the p$^-$-type base regions 2 to regions in which the p-type impurity element is activated. In the present example, hydrogen that forms the storage regions 21 is applied to the p$^-$-type base regions 2 on sides thereof closest to the front surface 10a of the semiconductor substrate 10 and is present in deeper regions therefrom. An activation rate of hydrogen as an n-type impurity is at most about 1% and much lower than an activation rate of the p-type impurity element forming the p$^-$-type base regions 2 and therefore, most of the regions in which hydrogen and the p-type impurity element forming the p$^-$-type base regions 2 are present become the p$^-$-type base regions 2.

A depth position from the back surface 10b of the semiconductor substrate 10 equal to a range Rp of the hydrogen ion irradiation (hereinafter, range position) Ph is a depth position (hereinafter, peak position or a first depth position) Pc that corresponds to a peak value Dc of the hydrogen concentration of the storage regions 21. In the example depicted in FIG. 4, the peak position Pc is a position deeper than the p⁻-type base regions 2. The storage regions 21 are formed by the hydrogen present a positions deeper than the p⁻-type base regions 2. The storage regions 21 are disposed in the semiconductor substrate 10, at positions of, for example, at least about 3 μm from the front surface 10a of the semiconductor substrate 10.

A hydrogen concentration distribution forming the storage regions 21, progressively decreases toward the front surface 10a of the semiconductor substrate 10 and the back surface 10b from the peak position Pc. A hydrogen concentration gradient of the storage regions 21 is more gradual for a second concentration distribution 21b (tail S of concentration distribution indicated by curve B in FIG. 5) that decreases from the peak position Pc toward the back surface 10b of the semiconductor substrate 10 than for a first concentration distribution 21a that decreases from the peak position Pc toward the front surface 10a of the semiconductor substrate 10. The peak position Pc of the hydrogen concentration of the storage regions 21 may be positioned in the p⁻-type base regions 2.

Further, as depicted in FIG. 3, a region (hereinafter, crystal defect region) 19a having a crystal defect density higher than that of other regions in the semiconductor substrate 10 is formed in the semiconductor substrate 10, closer to the back surface 10b of the semiconductor substrate 10 than are the storage regions 21. The crystal defect region 19a is a region in which crystal defects 22 formed by the hydrogen ion irradiation from the back surface 10b of the semiconductor substrate 10 for forming the storage regions 21 remain unrestored by the donor treatment thereafter.

The crystal defect region 19a is formed in a passage region of the hydrogen atoms ion implanted from the back surface 10b of the semiconductor substrate 10. A region from the back surface 10b of the semiconductor substrate 10 to the storage regions 21 and indicated by a double headed arrow in FIG. 3 is the crystal defect region 19a. A depth position (hereinafter, peak position or a second peak position) Ks at which a density of the crystal defects 22 of the crystal defect region 19a exhibits a peak value is present in the passage region of the hydrogen atoms and is closer to the back surface 10b of the semiconductor substrate 10 than are the storage regions 21. In FIG. 3, places where the density of the crystal defects 22 of the crystal defect region 19a has a peak value are indicated by "x".

The crystal defects 22 in the crystal defect region 19a suffice to be defects that become recombination centers (centers) of carriers and suffice to be mainly vacancies (V) or double vacancies (VV). A density of the crystal defects 22 suffices to be a density of the recombination centers. In general, while dopants such as donors and acceptors also contain crystal defects, herein, the crystal defects 22 are assumed to be defects that mainly function as recombination centers in the recombination of carriers. The crystal defects 22 in the crystal defect region 19a function as carrier lifetime killers.

The crystal defect region 19a is a carrier lifetime killer region in which carrier lifetime is shorter than that in other regions in the semiconductor substrate 10, due to the crystal defects 22 functioning as carrier lifetime killers. The carrier lifetime of the crystal defect region 19a is controlled by the hydrogen ion irradiation conditions (hydrogen dose amount and acceleration energy) and donor treatment conditions (heat treatment temperature and heat treatment time) for forming the storage regions 21. The hydrogen ion irradiation conditions and donor treatment conditions are set according to the thickness of the semiconductor substrate 10. In the FWD region 32, the closer is the crystal defect region 19a disposed to the p⁻-type base regions 2, the more advantageous.

By providing the crystal defect region 19a in the FWD region 32, reverse recovery characteristics may be enhanced. Further, during reverse bias of the FWD of the FWD region 32, a concentration of carriers in the p⁻-type base regions 2 of the FWD region 32 may be suppressed and destruction resistance may be enhanced.

The crystal defect region 19a may extend from the FWD region 32 to the border of the IGBT region 31 with the FWD region 32. The crystal defect region 19a may be provided in an entire area of the IGBT region 31 and the FWD region 32. The crystal defect region 19a is formed concurrently with the storage regions 21 by the hydrogen ion irradiation for forming the storage regions 21. Therefore, in an instance in which the crystal defect region 19a is provided only in the FWD region 32, in the FWD region 32, the storage regions 21 and the crystal defect region 19a may be formed concurrently by the hydrogen ion irradiation while in the IGBT region 31, the storage regions 21 alone may be formed by ion implantation of phosphorus (P) from the front surface 10a of the semiconductor substrate 10.

The interlayer insulating film 9 is provided on the front surface 10a of the semiconductor substrate 10 so as to cover the gate electrodes 8 and the dummy gate electrodes 18. In the contact holes 9c, 9a, 9b that penetrate the interlayer insulating film 9 in the depth direction Z and reach the semiconductor substrate 10, the gate runner 14a, and the conductive layers 14b are provided (refer to FIG. 2). The emitter electrode 11 is provided on the interlayer insulating film 9 so as to be embedded in the contact holes 9c, 9a, 9b. As described above, via the contact holes 9c, 9a, 9b, the emitter electrode 11 is in contact with regions exposed by the contact holes 9c, 9a, 9b.

In a surface layer of the semiconductor substrate 10 at the back surface 10b thereof, an n⁺-type buffer region 23 is provided at a position shallower from the back surface 10b of the semiconductor substrate 10 than is the n⁻-type drift region 1, the n⁺-type buffer region 23 being in contact with the n⁻-type drift region 1. The n⁺-type buffer region 23 is provided having a uniform thickness spanning from the IGBT region 31 to the FWD region 32. The thickness being uniform means that the thickness is substantially constant and within a range including error allowed for process variation.

The n⁺-type buffer region 23 may function as a field stop (FS) layer that suppresses a depletion layer from reaching a p⁺-type collector region 24, the depletion layer spreads from pn junctions between the p⁻-type base regions 2 and the storage regions 21 (or the n⁻-type drift region 1) toward the collector when the IGBT of the IGBT region 31 is OFF. The n⁺-type buffer region 23 may have multiple stepwise impurity concentration peak values at different depths from the back surface 10b of the semiconductor substrate 10.

Further, in a surface layer of the semiconductor substrate 10 at the back surface 10b thereof, the p⁺-type collector region (third semiconductor region, first portion) 24 and the n⁺-type cathode region (third semiconductor region, second portion) 26 are selectively provided at positions shallower from the back surface 10b of the semiconductor substrate 10 than is the n⁺-type buffer region 23. The p⁺-type collector region 24 is provided in the IGBT region 31. The p⁺-type collector region 24 has a p-type impurity concentration that is higher than an n-type impurity concentration of the n⁻-type drift region 1. The n⁺-type cathode region 26 is provided in the FWD region 32. The n$^+$-type cathode region 26 has an n-type impurity concentration that is higher than the n-type impurity concentration of the n$^-$-type drift region 1.

The n$^+$-type cathode region 26 is adjacent to the p$^+$-type collector region 24 in the first direction X. A border 25a between the p$^+$-type collector region 24 and the n$^+$-type cathode region 26 may be at a same position as that of a border between the IGBT region 31 and the FWD region 32. In this instance, a region indicated by reference numeral 25 in FIG. 3 is the n$^+$-type cathode region 26. A border 25a' between the p$^+$-type collector region 24 and the n$^+$-type cathode region 26 may be positioned in the FWD region 32. In this instance, the region indicated by reference numeral 25 in FIG. 3 is the p$^{++}$-type collector region 24.

The p$^{++}$-type collector region 24 and the n$^{++}$-type cathode region 26 are exposed at the back surface 10b of the semiconductor substrate 10. A collector electrode (second electrode) 27 is provided in an entire area of the back surface 10b of the semiconductor substrate 10 and is in contact with the p$^{++}$-type collector region 24 and the n$^{++}$-type cathode region 26. The collector electrode 27 doubles as a cathode electrode. A semiconductor material of the semiconductor substrate 10 used in the semiconductor device 30 according to the first embodiment may be silicon (Si) or silicon carbide (SiC), or may be a nitride semiconductor such as gallium nitride (GaN).

Figure 5:
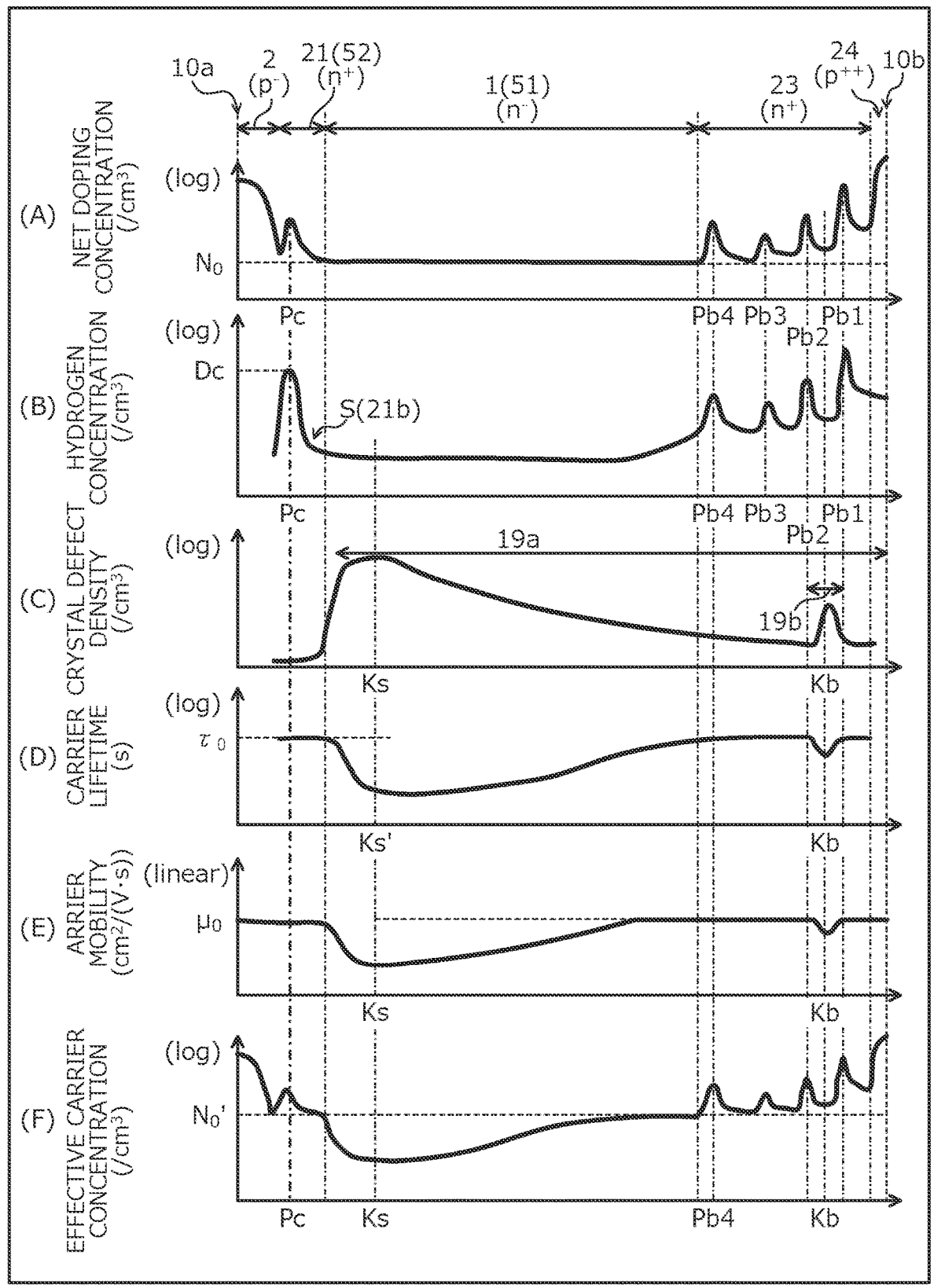
FIG. 5 is a characteristics diagram depicting distribution of various electrical characteristics along cutting line C1-C3 in FIG. 3.

Next, distribution of various electrical characteristics of the semiconductor device 30 according to the first embodiment is described. FIG. 5 is a characteristics diagram depicting distribution of various electrical characteristics along cutting line C1-C3 in FIG. 3. FIG. 5 depicts distribution of various electrical characteristics in the IGBT region 31 in an instance in which the storage regions 21 are formed by the hydrogen ion irradiation from the back surface 10b of the semiconductor substrate 10. In FIG. 5, distribution of various electrical characteristics in the n$^{++}$-type emitter regions 3 is not depicted.

Further, in FIG. 5, the n$^+$-type buffer region 23 is configured to have an impurity concentration that has multiple stepwise peak values. Reference characters Pb1, Pb2, Pb3, and Pb4 are depth positions indicating where the impurity concentration of the n$^+$-type buffer region 23 has peak values. While not depicted, depiction of distribution of various electrical characteristics in the FWD region 32 in an instance in which the storage regions 21 are formed by the hydrogen ion irradiation from the back surface 10b of the semiconductor substrate 10 may be obtained by replacing "the p$^{++}$-type collector region 24" in FIG. 5 with "the n$^{++}$-type cathode region 26".

In FIG. 5, a vertical axis represents net doping concentration, hydrogen concentration, crystal defect density, carrier lifetime, carrier mobility, and effective carrier concentration for curves A, B, C, D, and F, respectively. In FIG. 5, the vertical axis is indicated in logarithm (log) scale for curves A to D and F and is indicated in linear scale for curve E. In FIG. 5, a horizontal axis represents depth from the front surface 10a of the semiconductor substrate 10 in a linear scale for curves A to F. In FIG. 5, when the vertical axis is indicated in logarithm scale, an intersection with the horizontal axis is a predetermined value at least equal to 0.

In FIG. 5, curve A indicates net doping concentration distribution of electrically activated donors and acceptors of the semiconductor substrate 10 (i.e., distribution of difference of donor concentration and acceptor concentration). In the present example, the peak position Pc of the hydrogen concentration is at a position deeper in the depth direction Z than are the p$^-$-type base regions 2. Further, a peak (donor peak) value of the net doping concentration is at the peak position Pc of the hydrogen concentration. Regions including the peak position Pc and having a net doping concentration higher than that of the n$^-$-type drift region 1 are the storage regions 21.

As described above, the activation rate of hydrogen is generally lower than the activation rate of the p-type impurity element forming the p$^-$-type base regions 2. Therefore, when the peak position Pc of the hydrogen concentration overlaps a region in which the p-type impurity concentration is high, the peak position Pc of the hydrogen concentration is positioned in the p$^-$-type base regions 2 and the peak position of the net doping concentration of the n-type impurity may not coincide with the peak position Pc of the hydrogen concentration.

In FIG. 5, as depicted by curve A, a doping concentration of the n$^-$-type drift region 1 provided at a position deeper from the front surface 10a of the semiconductor substrate 10 than are the storage regions 21 coincides with a doping concentration No of the semiconductor substrate 10. In the n$^-$-type drift region 1 provided between the p$^{++}$-type collector region 24 and the storage regions 21, hydrogen ions injected from the back surface 10b of the semiconductor substrate 10 pass. The doping concentration of the n$^-$-type drift region 1 may be higher than the doping concentration No of the semiconductor substrate 10 due to hydrogen donors remaining after the donor treatment.

In FIG. 5, curve B indicates chemical concentration of hydrogen atoms ion implanted in the semiconductor substrate 10 and depicts impurity element concentration distribution including non-activated impurity elements. For example, an atomic concentration of atoms may be measured by secondary ion mass spectrometry (SIMS). In FIG. 5, the hydrogen concentration distribution indicated by curve B is a concentration distribution after diffusion by the annealing process (donor treatment) for converting ion implanted hydrogen atoms into donors. The extent of diffusion of the hydrogen atoms is controlled according to the process time and temperature, etc. of the donor treatment.

The hydrogen concentration distribution of the semiconductor substrate 10 exhibits the peak value Dc at the peak position Pc that is the range position Ph (refer to FIG. 4) of the hydrogen ion irradiation from the back surface 10b of the semiconductor substrate 10. As described above, the storage regions 21 are regions that include the peak position Pc of the hydrogen concentration. The peak position Pc of the hydrogen concentration of the storage regions 21 substantially coincides with the depth position where the hydrogen concentration distribution of the semiconductor substrate 10 has a peak value.

The hydrogen concentration of the storage regions 21 distribution has the tail S where the concentration decreases from the peak position Pc toward the back surface 10b of the semiconductor substrate 10. When the first and the second concentration distributions 21a, 21b (refer to FIG. 4) on both sides of the peak position Pc of the hydrogen concentration are compared, the tail S of the hydrogen concentration distribution exhibits a gradual concentration gradient of the second concentration distribution 21b. In other words, in the hydrogen concentration distribution of the semiconductor substrate 10, the tail S is pulled toward the back surface 10b where the hydrogen ions are injected. The tail S of the hydrogen concentration distribution may reach the back surface 10b of the semiconductor substrate 10.

In FIG. 5, curve C indicates crystal defect density of the semiconductor substrate 10 after the hydrogen ion irradiation and the donor treatment to the semiconductor substrate 10. In FIG. 5, the crystal defect density distribution indicated by curve C has a shape different from that of the hydrogen concentration distribution indicated by curve B in FIG. 5. As depicted by curve C in FIG. 5, the crystal defect density of the semiconductor substrate 10 exhibits a peak value at a peak position Ks closer to the back surface 10b of the semiconductor substrate 10 than are the storage regions 21 and decreases toward the back surface 10b of the semiconductor substrate 10.

The peak position Ks of the crystal defect density does not coincide with the peak position Pc of the hydrogen concentration. The crystal defect density distribution of the semiconductor substrate 10 may progressively decrease from the peak position Ks toward the front surface 10a of the semiconductor substrate 10. In this instance, the crystal defect density may be steep from the peak position Ks and monotonically low toward the front surface 10a of the semiconductor substrate 10 as compared to the crystal defect density from the peak position Ks toward the back surface 10b of the semiconductor substrate 10.

Near the peak position Pc of the hydrogen concentration, a large amount of hydrogen atoms terminate dangling bonds such as vacancies and double vacancies. Therefore, crystal defects are not present in the storage regions 21. Further, the peak position Ks of the crystal defect density is set so that crystal defects are not formed in the gate trench portions 5. In the $n^+$-type buffer region 23, a crystal defect region 19b may be present near a peak position Kb of the crystal defect density. The crystal defect region 19b may be formed by the hydrogen ion irradiation when the $n^+$-type buffer region 23 are formed or may be formed by ion implantation of helium (He) atoms or heavy metal atoms such as platinum (Pt) atoms. Further, the crystal defect region 19b needs not be completely recovered by the annealing process.

In FIG. 5, curve D indicates a carrier lifetime distribution of the semiconductor substrate 10 after the hydrogen ion irradiation and the donor treatment to the semiconductor substrate 10. As depicted by curve D in FIG. 5, the carrier lifetime distribution of the semiconductor substrate 10 has a shape that is an inverse of the shape of the crystal defect density distribution of the semiconductor substrate 10 indicated by curve C in FIG. 5, i.e., the y-axis is inversed. A depth position Ks' where the carrier lifetime has a smallest value coincides with the peak position Ks of the crystal defect density. In the storage regions 21, the carrier lifetime may be a maximum value T0.

In FIG. 5, curve E indicates distribution of effective carrier mobility of the semiconductor substrate 10 after the hydrogen ion irradiation and the donor treatment to the semiconductor substrate 10. As depicted by curve E in FIG. 5, the carrier mobility distribution of the semiconductor substrate 10 is higher, the longer is the carrier lifetime of the semiconductor substrate 10 indicated by curve D in FIG. 5 and is lower, the shorter is the carrier lifetime. In other words, carrier mobility is reduced in the crystal defect region 19a in which the carrier lifetime is controlled to be reduced.

In FIG. 5, curve F indicates effective carrier concentration distribution after the hydrogen ion irradiation and the donor treatment to the semiconductor substrate 10. The effective carrier concentration of the semiconductor substrate 10, for example, may be measured by a spreading resistance measurement method (SR measurement method). In the SR measurement method, the spreading resistance is converted to resistivity and from the resistivity, the effective carrier concentration is calculated. Assuming the resistivity is $\rho$ ($\Omega \cdot$cm), mobility is p (cm$^2$/(V·s)), and elementary charge is q (C), a calculation formula of the effective carrier concentration N(/cm$^3$) is N=1/($\mu$qp). Here, an ideal value of carrier mobility $\mu$ is used.

As depicted by curve F in FIG. 5, the effective carrier concentration decreases in an entire area of the crystal defect region 19a in which hydrogen atoms pass due to the hydrogen ion irradiation. On the other hand, near the range Rp of the hydrogen ion irradiation, the hydrogen concentration is high and therefore, a disorder state is mitigated by a termination effect of the hydrogen atoms and the mobility $\mu$ approaches a value of a crystal state free of crystal defects of the semiconductor substrate 10. Therefore, the effective carrier concentration of the storage regions 21 is higher than an effective carrier concentration $N_0'$ of the semiconductor substrate 10. Further, the hydrogen atoms in the storage regions 21 form hydrogen donors and therefore, the effective carrier concentration of the storage regions 21 is elevated at the peak position Pc of the hydrogen concentration.

Figure 6:
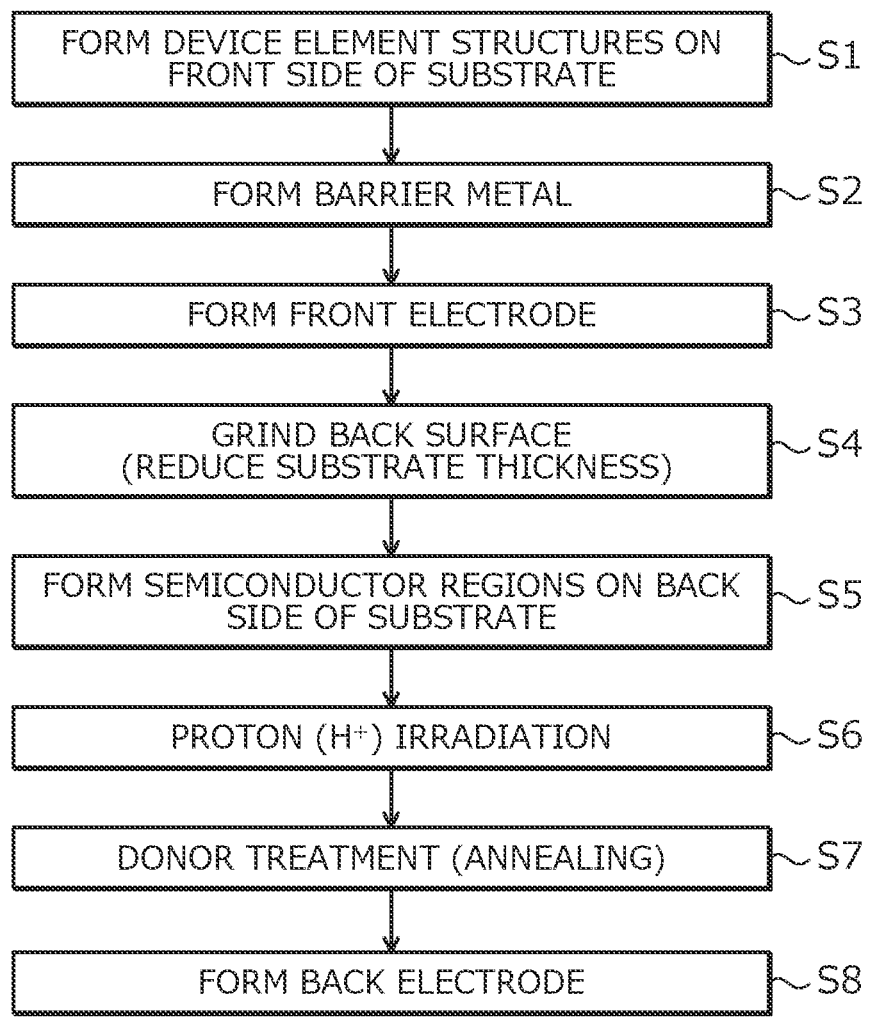
FIG. 6 is a flowchart of an outline of a method of manufacturing the semiconductor device according to the first embodiment.

Next, a method of manufacturing the semiconductor device 30 according to the first embodiment is described with reference to FIGS. 1 to 6. FIG. 6 is a flowchart of an outline of the method of manufacturing the semiconductor device according to the first embodiment.

First, predetermined device element structures are formed in the semiconductor substrate (semiconductor wafer) 10, at the front surface 10a thereof by a general method (step S1: first process). The predetermined device element structures are front-surface device element structures of the active region 41, the voltage withstanding structure of the edge termination region 42, the $p^+$-type well region 28, the interlayer insulating film 9, the gate runner 14a, and the conductive layers 14b. The front-surface device element structures of the active region 41 are the $p^-$-type base regions 2, the $n^+$-type emitter regions 3, the $p^+$-type contact regions 4, the gate trench portions 5, and the dummy trench portions 15 disposed in the IGBT region 31 and the FWD region 32 as described above.

Next, the barrier metal is formed along the surface of the interlayer insulating film 9 and portions of the front surface 10a of the semiconductor substrate 10 exposed in the contact holes 9a to 9c (step S2: second process), and front electrodes are formed on the barrier metal so as to be embedded in the contact holes 9a to 9c (step S3: second process). The front electrodes are the emitter electrode 11, the gate pad 12, and the gate wiring layer 13.

Next, a passivation film that covers the edge termination region 42 is formed on the front surface of the semiconductor substrate 10. Next, the semiconductor substrate 10 is ground from the back surface to a position corresponding to a product thickness used for the semiconductor device 30, whereby the thickness of the semiconductor substrate 10 is reduced (step S4: substrate thickness reduction). Next, by ion implantation of an impurity and an annealing process for impurity activation, predetermined semiconductor regions are formed in the semiconductor substrate 10, at the back surface 10b after grinding (step S5: third process).

The predetermined semiconductor regions of the back surface 10b of the semiconductor substrate 10 are the $n^+$-type buffer region 23, the $p^{++}$-type collector region 24, and the $n^{++}$-type cathode region 26. In the process at step S5, the impurities ion implanted to form the $n^+$-type buffer region 23, the $p^+$-type collector region 24, and the $n^{++}$-type cathode region 26 are, for example, hydrogen (H) atoms, boron (B) atoms, and phosphorus (P) atoms, respectively.

When the $n^+$-type buffer region 23 is formed, protons (H$^+$) are irradiated by a predetermined range Rp from the back surface 10b of the semiconductor substrate 10 and the annealing process (donor treatment) for converting the introduced protons into donors is performed. Regarding the proton irradiation and the donor treatment, the donor treatment may be performed each time the proton irradiation is performed, or the donor treatment may be performed one time after protons have been irradiated multiple times. The proton irradiation, for example, may be irradiation by a hydrogen ion cyclotron accelerator or a Van de Graaff generator.

Next, the protons are irradiated by a predetermined range Rp from the back surface 10b of the semiconductor substrate 10 (step S6: fourth process, first hydrogen ion implantation process). The proton irradiation at step S6 corresponds to the hydrogen ion irradiation for forming the storage regions 21 and the crystal defect region 19a described above. The proton irradiation at step S6, for example, may be irradiation by a hydrogen ion cyclotron accelerator or a Van de Graaff generator.

By the proton irradiation at step S6, hydrogen atoms are introduced at a high concentration at the range position Ph of the proton irradiation. By these hydrogen ions (hydrogen atoms) introduced at a high concentration, n-type impurity regions that form the storage regions 21 are formed in semiconductor crystals. Further, during the proton irradiation at step S6, hydrogen ions pass the semiconductor crystals by a high acceleration energy, whereby the crystal defects 22 that function as recombination centers are formed in a proton passage region from the back surface 10b of the semiconductor substrate 10 to an n-type impurity region.

The range Rp of the proton irradiation at step S6 is set to the peak position Pc of the hydrogen concentration of the storage regions 21. The number of the crystal defects 22 formed by the proton irradiation at step S6 is greatest just before the range position Ph of the proton irradiation at step S6, i.e., at a depth position (the peak position Ks, refer to FIG. 5) closer to the back surface 10b of the semiconductor substrate 10 than is the range position Ph of the proton irradiation. Formation of the crystal defects 22 in the proton passage region appears as an effective carrier concentration decrease of the proton passage region.

Next, the annealing process (donor treatment) for converting the protons introduced at step S6 into donors is performed (step S7: fifth process, first annealing process). By the donor treatment at step S7, hydrogen atoms near the range Rp of the proton irradiation are converted into hydrogen donors and the storage regions 21 are formed near the range Rp of the proton irradiation. The donor treatment at step S7 may be performed at a temperature that is at most the temperature of the donor treatment for the protons at step S5. The crystal defect region 19a is formed by the crystal defects 22 that remain unrecovered in the proton passage region from the back surface 10b of the semiconductor substrate 10 to the storage regions 21.

Here, a dose amount for the proton irradiation at step S6 suffices to be at least about $1\times10^{11}/cm^2$ and may be at least about $1\times10^{12}/cm^2$. When the dose amount of the proton irradiation is at least $1\times10^{12}/cm^2$, carrier lifetime of a proton passage region 51 may be reduced and the hydrogen atoms are converted into donors by the subsequent donor treatment at step S7, whereby hydrogen donor regions 52 that form the storage regions 21 are formed. The higher is the dose amount at which the proton irradiation is performed, the shorter the carrier lifetime of the proton passage region 51 becomes and the higher the effective carrier concentration of the hydrogen donor regions 52 becomes. The dose amount of the proton irradiation is set to be at least $1\times10^{14}/cm^2$, whereby the effect of the storage regions 21 may be increased.

Further, the proton irradiation at step S6 and the donor treatment at step S7 are performed under conditions such that the hydrogen concentration of the storage regions 21 becomes the predetermined peak value Dc and the carrier lifetime of the proton passage region 51 becomes a desired time. The conditions of the proton irradiation at step S6 are adjusted according to the thickness of the semiconductor substrate 10 after reduction of the substrate thickness. For example, an example of the conditions of the proton irradiation at step S6 is as follows.

In an instance of the semiconductor device 30 having breakdown voltage of 600V, the thickness of the semiconductor substrate 10 after reduction of the substrate thickness is about 60 μm. In this instance, the range and the acceleration energy of the proton irradiation at step S6 are about 58 μm and about 2.3 MeV, respectively, and dispersion is about 2.6 μm. Therefore, for example, by setting the dose amount of the proton irradiation to about $2\times10^{14}/cm^2$, the storage regions 21 having a peak concentration of about $4\times10^{15}/cm^3$ may be obtained.

In an instance in which the semiconductor device 30 has breakdown voltage of 800V, the thickness of the semiconductor substrate 10 after reduction of the substrate thickness is about 80 μm. In this instance, the range and the acceleration energy of the proton irradiation at step S6 is about 78 μm and about 2.8 MeV, respectively, and dispersion is about 3.6 μm. Therefore, for example, by setting the dose amount of the proton irradiation to about $3\times10^{14}/cm^2$, the storage regions 21 having a peak concentration of about $4\times10^{15}/cm^3$ may be obtained.

In an instance of the semiconductor device 30 having breakdown voltage of 1200V, the thickness of the semiconductor substrate 10 after reduction of the substrate thickness is about 120 μm. In this instance, the range and the acceleration energy of the proton irradiation at step S6 are about 118 μm and about 3.5 MeV, respectively, and dispersion is about 5.1 μm. Therefore, for example, by setting the dose amount of the proton irradiation to about $4\times10^{14}/cm^2$, the storage regions 21 having a peak concentration of about $4\times10^{15}/cm^3$ may be obtained.

In the donor treatment at step S7, for example, the entire semiconductor substrate 10 is heated for about a few minutes to a few hours in a gas atmosphere of a high temperature (for example, about 350 degrees C. to 450 degrees C.). Even when protons are diffused to the front surface 10a of the semiconductor substrate 10 by this donor treatment or are injected therein by the proton irradiation at step S6, the impurity concentration of the p$^-$-type base regions 2 is about $1\times10^{17}/cm^3$ and therefore, provided conditions are the proton irradiation conditions of step S6 described above, the p$^-$-type base regions 2 are not adversely affected by the protons.

After step S6, the crystal defect region 19b may be formed by ion implantation of helium atoms, etc. from the back surface 10b of the semiconductor substrate 10. After step S7, the collector electrode 27 is formed as a back electrode on the back surface 10b of the semiconductor substrate 10 (step S8: sixth process). By the processes up to here, the net doping concentration, the hydrogen concentration, the crystal defect density, the carrier lifetime, the carrier mobility, and the effective carrier concentration in the semiconductor substrate 10 exhibit the distributions indicated by the curves A to F in FIG. 5. Thereafter, the semiconductor substrate (semiconductor wafer) 10 is diced (cut) into individual chips, whereby the semiconductor device 30 depicted in FIGS. 1 to 5 is completed.

The semiconductor device 30 may be soldered to a circuit board such as a direct copper bond (DCB) substrate. At this time, a soldering temperature may be lower than the temperature of the donor treatment at step S7. For example, the soldering temperature may be in a range from 280 degrees C. to 400 degrees C. As a result, termination of the crystal defects 22 by hydrogen may be suppressed.

As described above, according to the first embodiment, the hydrogen ion irradiation is performed one time from the back surface of the semiconductor substrate with the range position directly beneath the p⁻-type base regions. As a result, hydrogen ions are introduced at a high concentration directly beneath the p⁻-type base regions; n-type impurity regions that become the storage regions are formed in the regions in which the hydrogen ions are introduced at a high concentration and crystal defects are formed in the passage region of the hydrogen ions. The crystal defect density of hydrogen ions in the passage region is greatest at a depth position closer to the back surface of the semiconductor substrate than is the range position of the hydrogen ion irradiation. Thereafter, the annealing process (donor treatment) for converting the hydrogen atoms into donors is performed, whereby the storage regions and the crystal defect region are formed. In other words, by one session of the hydrogen ion irradiation for forming the storage regions, the storage regions and the crystal defect region may be formed concurrently, thereby enabling simplification of the manufacturing process. Further, according to the first embodiment, by performing the hydrogen ion irradiation from the back surface of the semiconductor substrate, crystal defects are not formed in the channel forming regions and therefore, effects on threshold values and leak current may be suppressed. Further, lower energy is used as compared to helium ion irradiation and therefore, implementation by low-cost equipment is possible.

Figure 7:
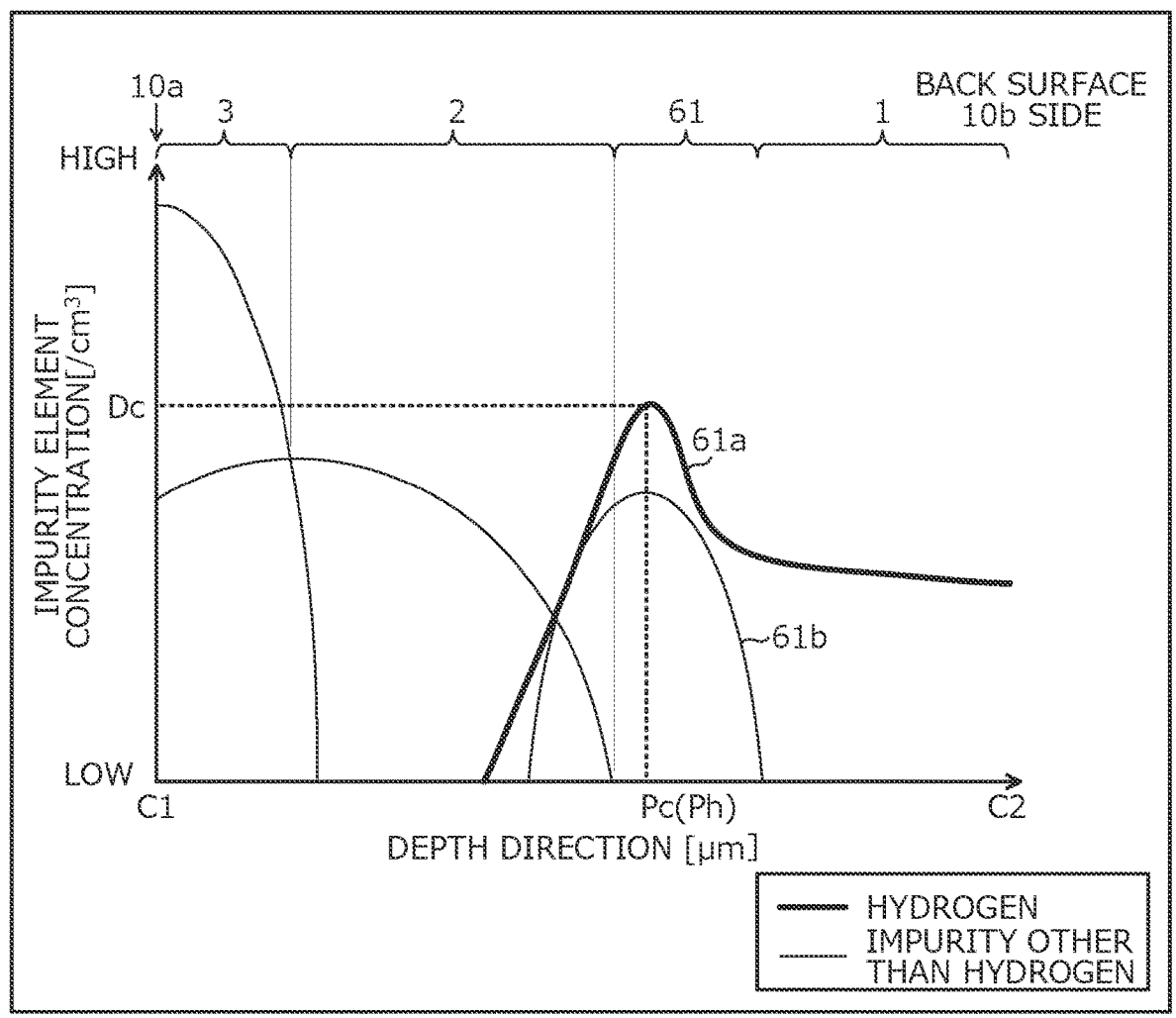
FIG. 7 is a characteristics diagram depicting impurity concentration distribution in a IGBT region of a semiconductor device according to a second embodiment.
Figure 8:
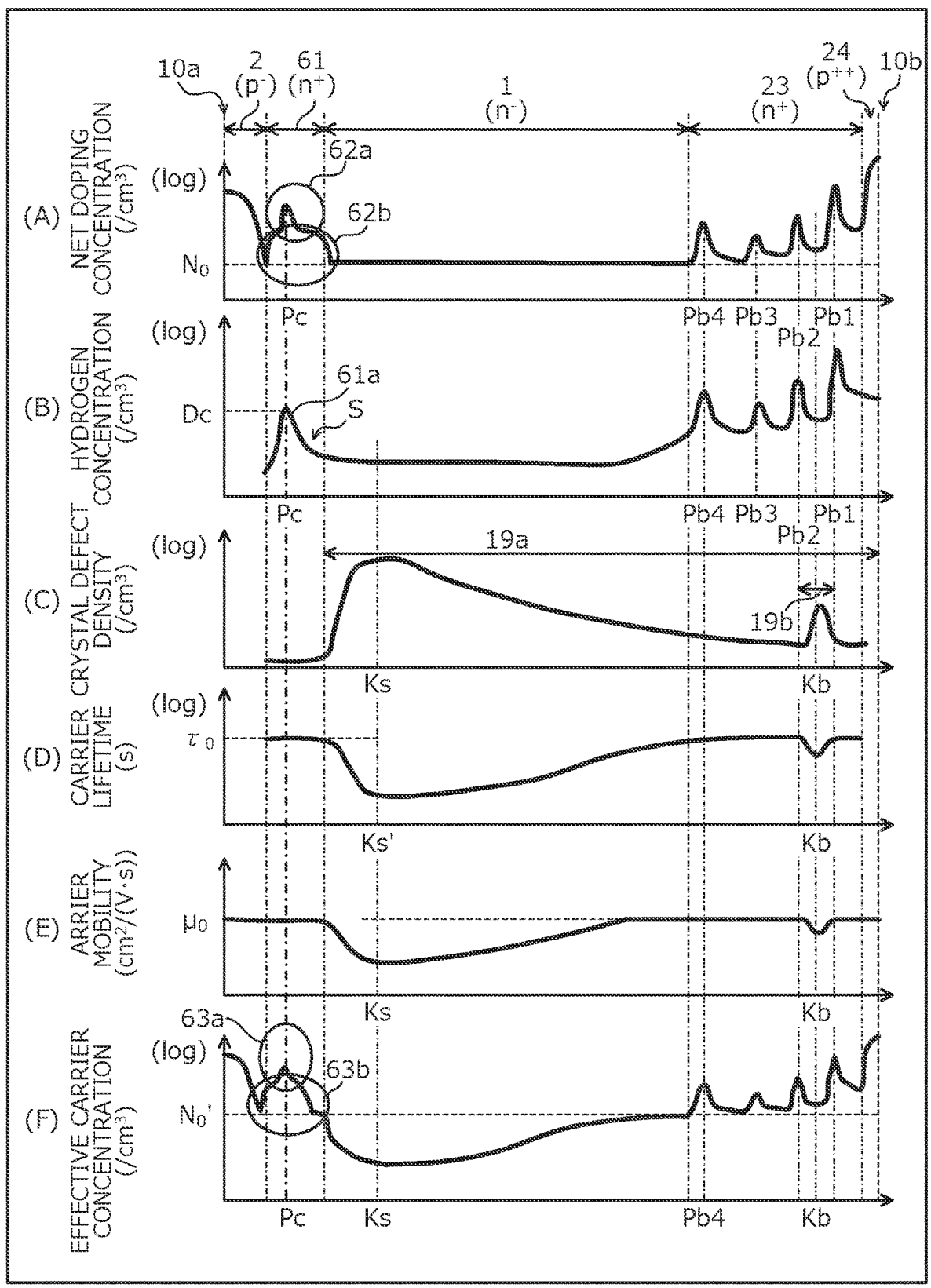
FIG. 8 is a characteristics diagram depicting distribution of various electrical characteristics in the IGBT region of the semiconductor device according to the second embodiment.

Next, a structure of a semiconductor device according to a second embodiment is described. FIG. 7 is a characteristics diagram depicting impurity concentration distribution in a IGBT region in an instance in which the storage regions (fourth semiconductor regions) 21 are formed by hydrogen ion irradiation of the semiconductor device according to the second embodiment. FIG. 8 is a characteristics diagram depicting distribution of various electrical characteristics in the IGBT region of the semiconductor device according to the second embodiment. A layout when viewed from the front side of the semiconductor substrate 10 and a cross-sectional view of the structure of the semiconductor device according to the second embodiment are similar to those of the semiconductor device 30 according to the first embodiment and equivalent to replacing reference numeral 21 with reference numeral 61 in FIGS. 1 to 3. FIG. 7 depicts concentration distribution along cutting line C1-C2 in FIG. 3. FIG. 7 depicts an impurity element concentration distribution including non-activated impurity elements. FIG. 8 depicts distribution of various electrical characteristics along cutting line C1-C3 in FIG. 3.

FIG. 8 depicts distribution of various electrical characteristics in the IGBT region 31 in an instance in which the storage regions 61 are formed by the hydrogen ion irradiation from the back surface 10b of the semiconductor substrate 10. In FIG. 8, distribution of various electrical characteristics in the n⁺⁺-type emitter regions 3 is not depicted. Further, in FIG. 8, the n⁺-type buffer region 23 is configured to have an impurity concentration that has multiple stepwise peak values. Reference characters Pb1, Pb2, Pb3, and Pb4 are depth positions indicating where the impurity concentration of the n⁺-type buffer region 23 has peak values.

While not depicted, depiction of distribution of various electrical characteristics in the FWD region 32 in an instance in which the storage regions 21 are formed by the hydrogen ion irradiation from the back surface 10b of the semiconductor substrate 10 may be obtained by replacing "the p⁺⁺-type collector region 24" in FIG. 8 with "the n⁺⁺-type cathode region 26".

In FIG. 8, a vertical axis represents net doping concentration, hydrogen concentration, crystal defect density, carrier lifetime, carrier mobility, and effective carrier concentration for curves A, B, C, D, and F, respectively. In FIG. 8, the vertical axis is indicated in logarithm (log) scale for curves A to D and F and is indicated in linear scale for curve E. In FIG. 8, a horizontal axis represents depth from the front surface 10a of the semiconductor substrate 10 in a linear scale for curves A to F. In FIG. 8, when the vertical axis is indicated in logarithm scale, an intersection with the horizontal axis is a predetermined value at least equal to 0.

The semiconductor device according to the second embodiment differs from the semiconductor device 30 according to the first embodiment in that the storage regions 61 contain an n-type impurity other than hydrogen. In particular, as depicted in FIG. 7, the storage regions 61 of the second embodiment contain hydrogen atoms as an impurity and contain, for example, phosphorus (P) atoms as an n-type impurity. A hydrogen concentration distribution 61a of the storage regions 61 of the second embodiment is similar to that for the storage regions 21 of the first embodiment (refer to FIG. 4 and curve B in FIG. 5).

The n-type impurity other than hydrogen of the storage regions 61 of the second embodiment, for example, is introduced by ion implantation for which a range is set to be near the range Rp of the hydrogen ion irradiation. An n-type impurity concentration distribution 61b (other than for hydrogen) of the storage regions 61 of the second embodiment may exhibit substantially Gaussian distribution in which the range of the ion implantation of the n-type impurity in the storage regions 61 is set as a peak position. Further, the n-type impurity concentration distribution 61b may have a substantially trapezoid shape by performing multiple ion implantations for which the acceleration energy differs.

In the storage regions 61 of the second embodiment, a peak position of the n-type impurity concentration distribution 61b (other than for hydrogen) may differ from the peak position Pc of the hydrogen concentration distribution 61a of the storage regions 61 of the second embodiment. In the storage regions 61 of the second embodiment, a peak value of the n-type impurity concentration distribution 61b (other than for hydrogen), for example, is lower than the peak value Dc of the hydrogen concentration distribution 61a of the storage regions 61 of the second embodiment.

In FIG. 8, curve A indicates net doping concentration distribution of electrically activated donors and acceptors of the semiconductor substrate 10. As depicted by curve A in FIG. 8, the net doping concentration distribution of the storage regions 61 of the second embodiment is a combined distribution of a net doping concentration distribution 62a due to hydrogen atoms in the storage regions 61 and a net doping concentration distribution 62b due to the n-type impurity other than the hydrogen in the storage regions 61.

In FIG. 8, curve F indicates effective carrier concentration distribution after the hydrogen ion irradiation, the phosphorus ion implantation, and the donor treatment to the semiconductor substrate 10. As depicted by curve F in FIG. 8, the effective carrier concentration distribution of the storage regions 61 of the second embodiment is a combined distribution of a carrier concentration distribution 63a due to the hydrogen atoms in the storage regions 61 and a carrier concentration distribution 63b due to the n-type impurity other than the hydrogen in the storage regions 61.

For the semiconductor device according to the second embodiment, the hydrogen concentration distribution (curve B in FIG. 8), the crystal defect density distribution (curve C in FIG. 8), and the carrier lifetime distribution (curve D in FIG. 8) are respectively similar to the hydrogen concentration distribution (curve B FIG. 5), the crystal defect density distribution (curve C in FIG. 5), and the carrier lifetime distribution (curve D in FIG. 5) for the semiconductor device 30 according to the first embodiment.

As described above, according to the second embodiment, effects similar to those of the first embodiment may be obtained. Further, according to the second embodiment, the effective carrier concentration of the storage region may be increased by the amount of the carrier concentration due to the n-type impurity other than the hydrogen. Therefore, for example, this is useful in instances in which it is desirable to reduce the crystal defects (carrier lifetime killers) that are to be introduced into the crystal defect region. In other words, even when the dose amount of the hydrogen ion irradiation for forming the storage regions is reduced and the crystal defect density of the crystal defect region is reduced, the effective carrier concentration of the storage regions may be increased by introducing an n-type impurity other than the hydrogen in the storage regions.

In the second embodiment, while an instance in which the n-type impurity concentration distributions 61b, 62b, 63b other than for the hydrogen of the storage regions 61 are wider than distribution near concentration peaks of the hydrogen concentration distributions 61a, 62a, 63a is described as an example using FIGS. 7 and 8, the hydrogen concentration distributions 61a, 62a, 63a may be wider than the n-type impurity concentration distributions 61b, 62b, 63b other than for the hydrogen. While the peak position Pc of the hydrogen concentration and the peak position of the n-type impurity concentration other than hydrogen substantially coincide, said peak positions may be apart from one another.

For example, the peak position Pc of the hydrogen concentration distribution indicated by curve B in FIG. 8 and the peak position of the effective carrier concentration of the storage regions 61 indicated by curve F in FIG. 8 need not coincide since a contribution of the n-type impurity other than hydrogen is large. Alternatively, the effective carrier concentration of the storage regions 61 indicated by curve F in FIG. 8 may be substantially uniform in the depth direction Z (depth direction). Further, the peak position Pc of the hydrogen concentration distribution may be positioned in the p$^-$-type base regions 2.

Figure 9:
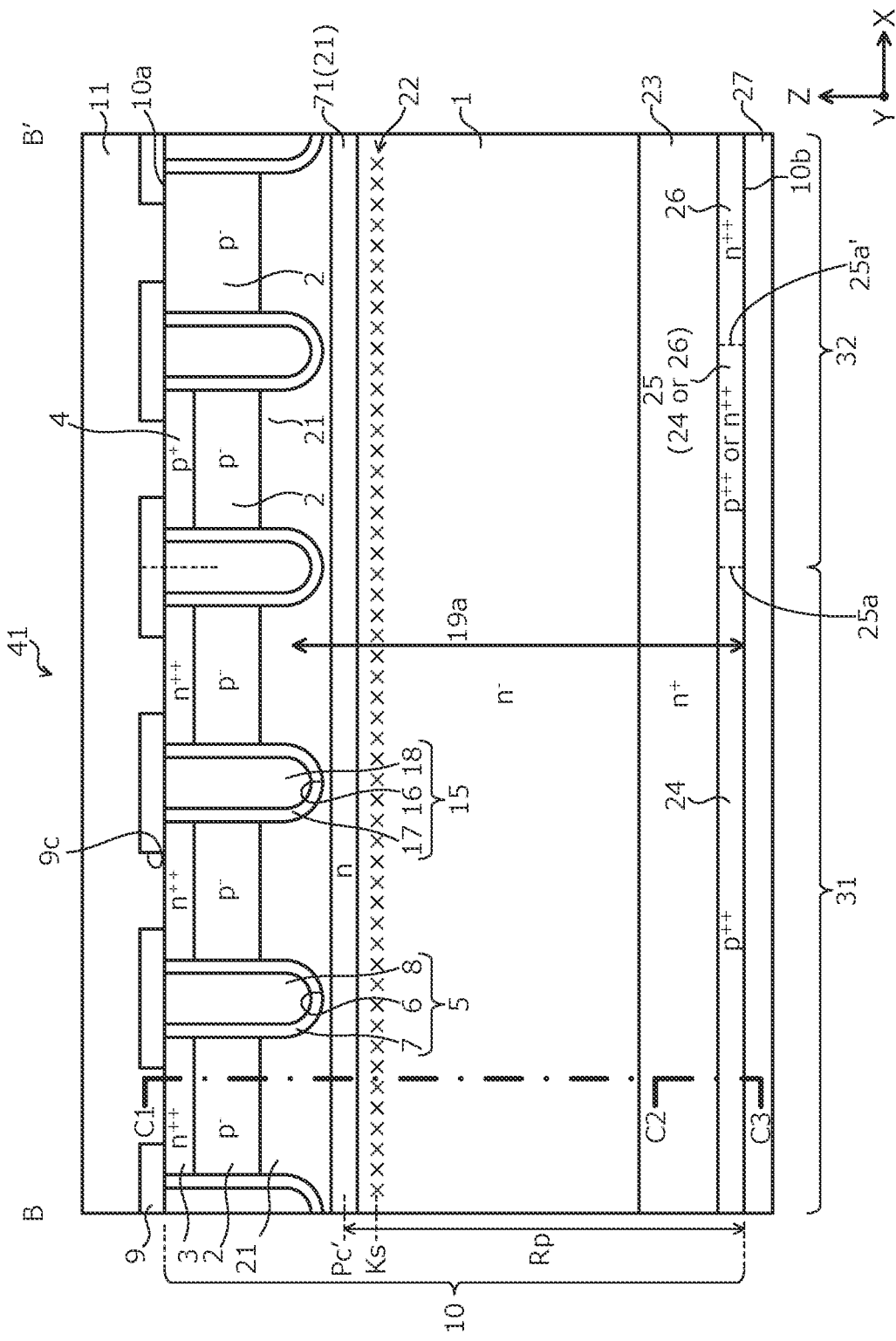
FIG. 9 is a cross-sectional view of a structure of a semiconductor device according to a third embodiment.
Figure 10:
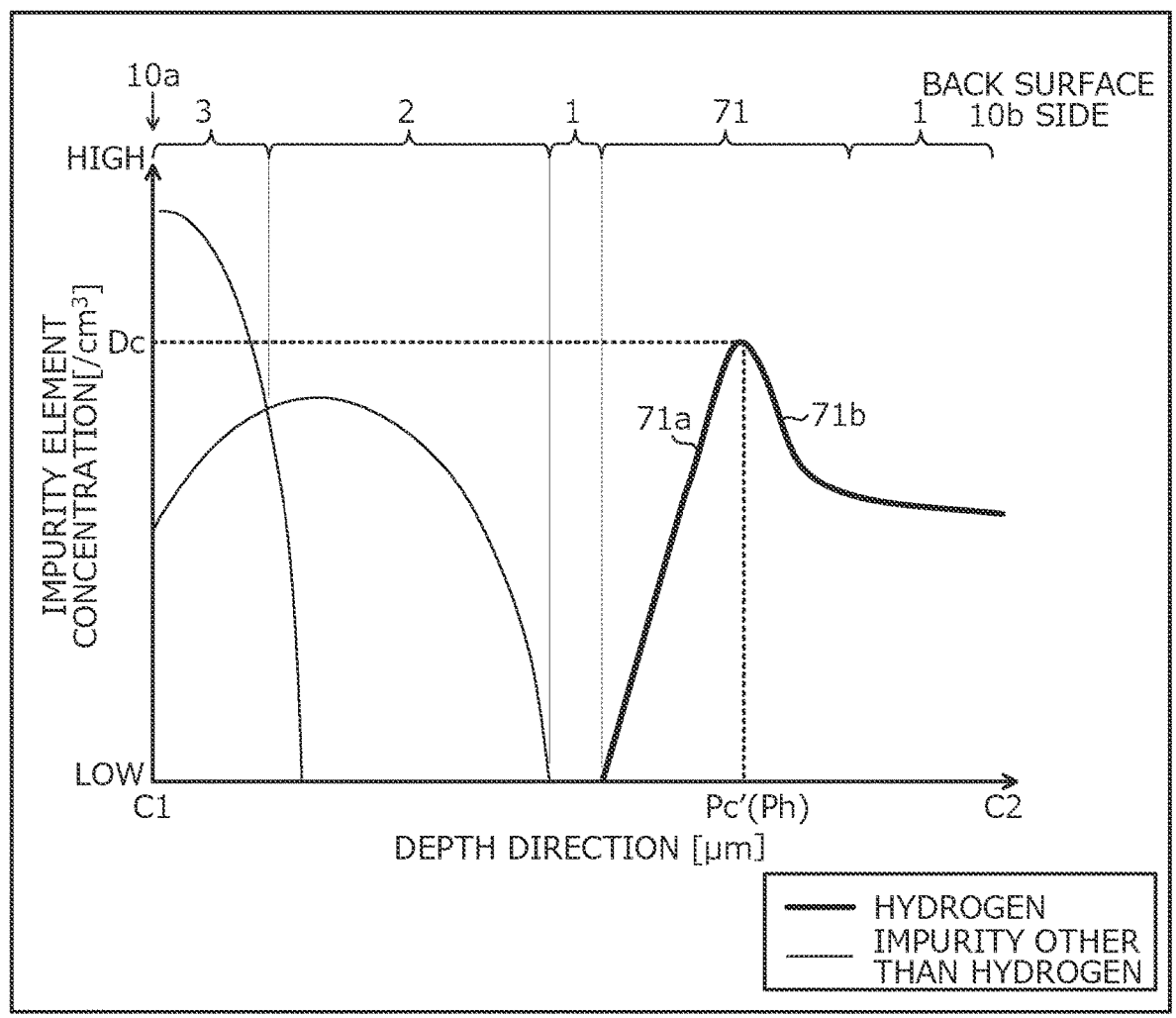
FIG. 10 is a characteristics diagram depicting impurity concentration distribution in the IGBT region of the semiconductor device according to the third embodiment.

Next, a structure of a semiconductor device according to a third embodiment is described. FIG. 9 is a cross-sectional view of the structure of the semiconductor device according to the third embodiment. The semiconductor device according to the third embodiment differs from the semiconductor device according to the first embodiment in that storage regions 71 formed by the hydrogen ion irradiation are separate from the p$^-$-type base regions 2. FIG. 10 is a characteristics diagram depicting impurity concentration distribution in the IGBT region of the semiconductor device according to the third embodiment, in an instance in which the storage regions (fourth semiconductor regions) 21 are formed by the hydrogen ion irradiation. FIG. 10 depicts impurity element concentration distribution including non-activated impurity elements.

Figure 11:
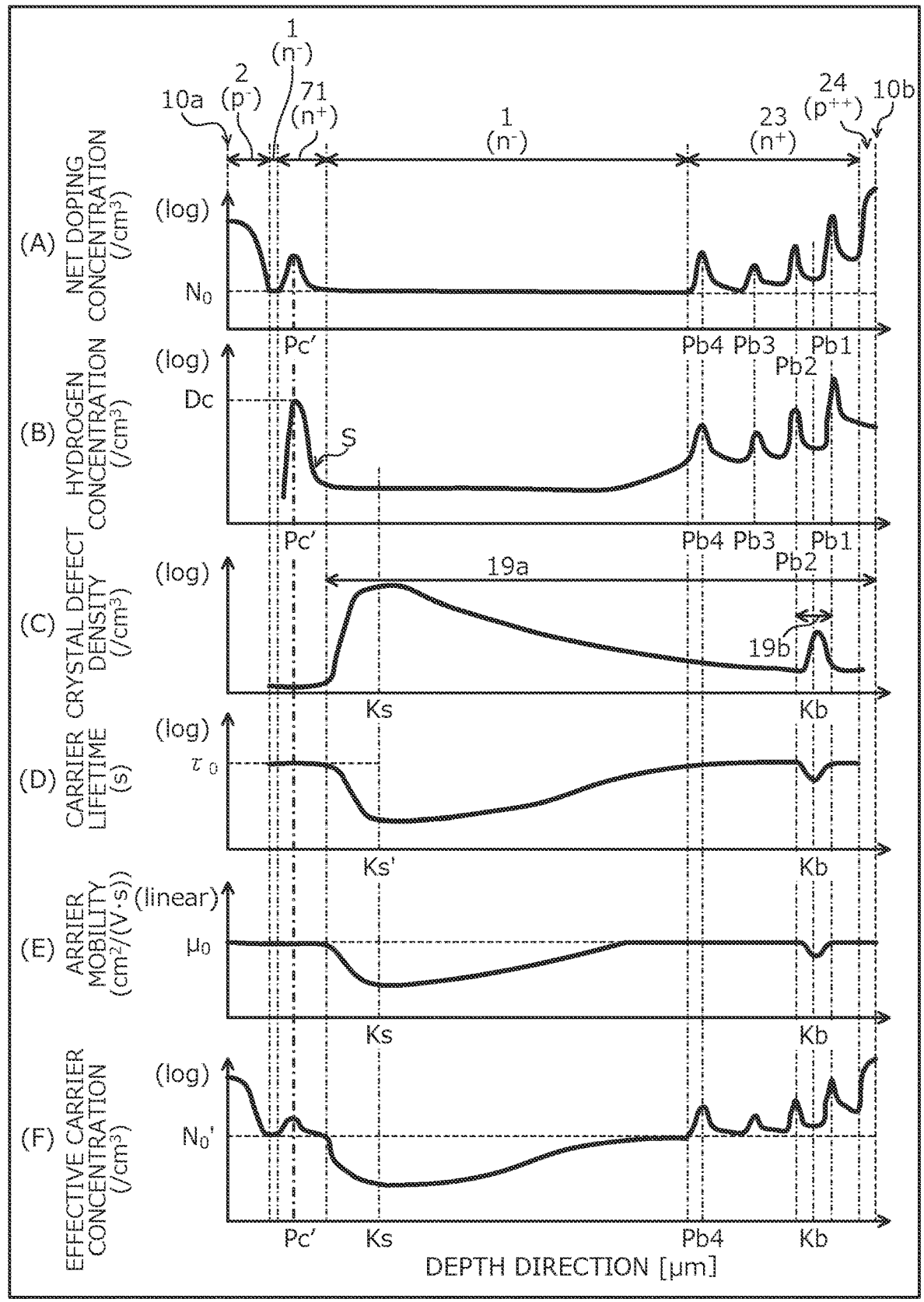
FIG. 11 is a characteristics diagram depicting distribution of various electrical characteristics in the IGBT region of the semiconductor device according to the third embodiment.

FIG. 11 is a characteristics diagram depicting distribution of various electrical characteristics in the IGBT region of the semiconductor device according to the third embodiment. A layout of the semiconductor device according to the third embodiment when viewed from the front side of the semiconductor substrate 10 is similar to that of the semiconductor device 30 according to the first embodiment. FIG. 10 depicts concentration distribution along cutting line C1-C2 in FIG. 9. FIG. 11 depicts distribution of various electrical characteristics along cutting line C1-C3 in FIG. 9.

FIG. 11 depicts distribution of various electrical characteristics in the IGBT region 31 in an instance in which the storage regions 71 are formed by the hydrogen ion irradiation from the back surface 10b of the semiconductor substrate 10. In FIG. 11, distribution of various electrical characteristics in the n$^{++}$-type emitter regions 3 is not depicted. Further, in FIG. 11, the n$^+$-type buffer region 23 is configured to have an impurity concentration that has multiple stepwise peak values. Reference characters Pb1, Pb2, Pb3, and Pb4 are depth positions indicating where the impurity concentration of the n$^+$-type buffer region 23 has peak values. While not depicted, depiction of distribution of various electrical characteristics in the FWD region 32 in an instance in which the storage regions 21 are formed by the hydrogen ion irradiation from the back surface 10b of the semiconductor substrate 10 may be obtained by replacing "the p$^{++}$-type collector region 24" in FIG. 11 with "the n$^{++}$-type cathode region 26".

In FIG. 11, a vertical axis represents net doping concentration, hydrogen concentration, crystal defect density, carrier lifetime, carrier mobility, and effective carrier concentration for curves A, B, C, D, and F, respectively. FIG. 11, the vertical axis is indicated in logarithm (log) scale for curves A to D and F and is indicated in linear scale for curve E. In FIG. 11, a horizontal axis represents depth from the front surface 10a of the semiconductor substrate 10 in a linear scale for curves A to F. In FIG. 11, when the vertical axis is indicated in logarithm scale, an intersection with the horizontal axis is a predetermined value at least equal to 0.

The semiconductor device according to the third embodiment differs from the semiconductor device according to the first embodiment in that the hydrogen concentration distribution of the storage regions 71 and a p-type impurity concentration distribution of the p$^-$-type base regions 2 are apart from one another. In other words, hydrogen atoms irradiated on the semiconductor substrate 10 by the hydrogen ion irradiation for forming the storage regions 71 of the third embodiment are not contained in the p$^-$-type base regions 2, near the storage regions 71. The storage regions 71 of the third embodiment are formed by the hydrogen ion irradiation using acceleration energy that is low as compared to that during formation of the storage regions 21 of the first embodiment.

A peak position Pc' of the storage regions 71 of the third embodiment is positioned closer to the back surface 10b of the semiconductor substrate 10 than is the peak position Pc (refer to FIGS. 4 and 5) of the storage regions 21 of the first embodiment. A first concentration distribution 71a that progressively decreases from the peak position Pc' to the back surface 10b of the semiconductor substrate 10 is apart from the p-type impurity concentration distribution of the p$^-$-type base regions 2 by the amount by which the peak position Pc' of the storage regions 71 of the third embodiment is shifted toward the back surface 10b of the semiconductor substrate 10. The n$^-$-type drift region 1 having the doping concentration No of the semiconductor substrate 10 is left between the p⁻-type base regions 2 and the storage regions 71.

Gradients of the first and the second concentration distributions 71a, 71b that progressively decrease from the peak position Pc of the storage regions 71 of the third embodiment toward the front surface 10a of the semiconductor substrate 10 and the back surface 10b, respectively, are similar to those of the first and the second concentration distributions 21a, 21b (refer to FIG. 4) of the storage regions 21 of the first embodiment.

The net doping concentration (curve A in FIG. 11), the crystal defect density (curve C in FIG. 11), the carrier lifetime (curve D in FIG. 11), the carrier mobility (curve E in FIG. 11), and the effective carrier concentration (curve F in FIG. 11) of the semiconductor device according to the third embodiment exhibit distribution in which a portion affected by the hydrogen concentration of the storage regions 71 is shifted toward the back surface 10b of the semiconductor substrate 10 by the amount that the peak position Pc' of the hydrogen concentration distribution of the storage regions 71 is shifted toward the back surface 10b of the semiconductor substrate 10. The hydrogen concentration (curve B in FIG. 5) of the semiconductor device according to the third embodiment is an impurity element concentration distribution including non-activated impurity elements.

As described above, according to the third embodiment, acceleration energy of the hydrogen ion irradiation for forming the storage regions is reduced and the storage regions may be formed apart from the p⁻-type base regions.

In the third embodiment, while an instance in which the storage regions 71 are formed closer to the back surface of the semiconductor substrate 10 than are lower ends of the gate trenches 6 and lower ends of the dummy trenches 16 is described as an example using FIG. 9, upper ends or lower ends of the storage regions 71 may be in regions sandwiched between adjacent trenches (the gate trenches 6 and the dummy trenches 16). Further, according to the third embodiment, hydrogen ions are not irradiated to the gate trench portions 5 or an irradiation amount thereof is low and therefore, adverse effects on the gate insulating films by the hydrogen ion irradiation may be eliminated or reduced.

Figure 12:
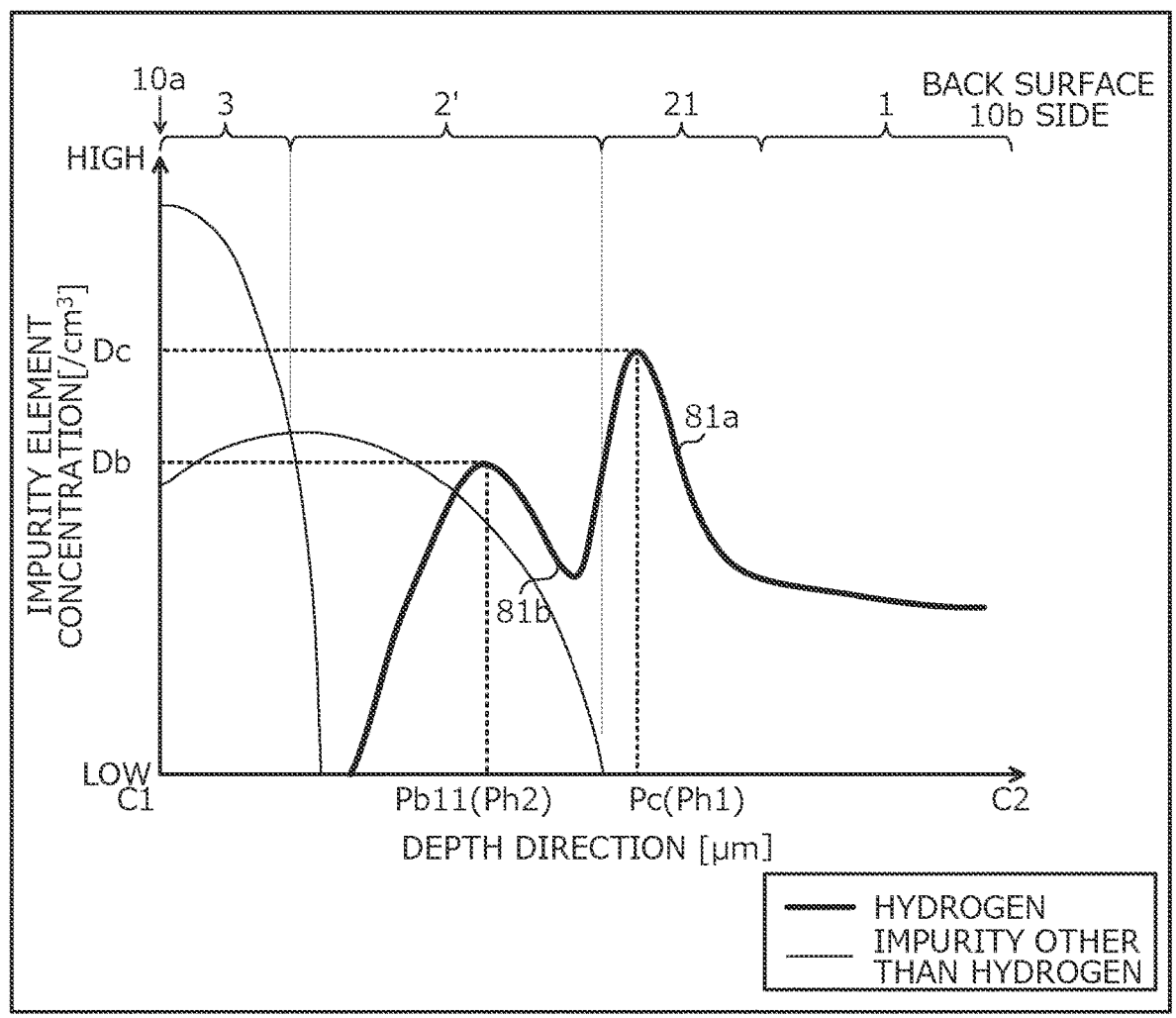
FIG. 12 is a characteristics diagram depicting impurity concentration distribution in the IGBT region of a semiconductor device according to a fourth embodiment.

Next, a structure of a semiconductor device according to a fourth embodiment is described. FIG. 12 is a characteristics diagram depicting impurity concentration distribution in the IGBT region in an instance in which the storage regions (fourth semiconductor regions) 21 of the semiconductor device according to the fourth embodiment are formed by the hydrogen ion irradiation. FIG. 12 depicts concentration distribution along cutting line C1-C2 in FIG. 3. A layout when viewed from the front side of the semiconductor substrate 10 and a cross-sectional of the structure of the semiconductor device according to the fourth embodiment are similar to those of the semiconductor device 30 according to the first embodiment and depiction thereof may be obtained by replacing reference numeral 2 with reference numeral 2' in FIGS. 1 to 3.

The semiconductor device according to the fourth embodiment differs from the semiconductor device according to the first embodiment in that a hydrogen concentration distribution is formed exhibiting a predetermined peak value Db at a depth position (peak position) Pb11 in the p⁻-type base regions 2'. In other words, in the semiconductor substrate 10, a hydrogen concentration distribution 81a exhibiting the peak value Dc at the peak position Pc in the storage regions 21 and a hydrogen concentration distribution 81b exhibiting the peak value Db at the peak position Pb11 in the p⁻-type base regions 2' are formed.

In the fourth embodiment, the hydrogen ion irradiation for which the peak position Pc in the storage regions 21 is set as the range position Ph1 and the hydrogen ion irradiation for which the peak position Pb11 in the p⁻-type base regions 2' is set as the range position Ph2 suffice to be performed. In other words, the proton irradiation at step S6 (FIG. 6) is performed two times by different acceleration energies (first and second hydrogen ion implantation processes). By the hydrogen ion irradiation for which the peak position Pb11 in the p⁻-type base regions 2' is set at the range position Ph2, hydrogen ions are introduced at a high concentration in the p⁻-type base regions 2', not only the storage regions 21. The donor treatment (first and second annealing processes) at step S7 may be performed each time the proton irradiation at step S6 is performed.

By introducing the hydrogen ions at a high concentration in the p⁻-type base regions 2', crystal defects in the p⁻-type base regions 2' may be recovered by the donor treatment. Further, in an instance in which, for example, the impurity concentration of the p⁻-type base regions 2' of the FWD region 32 is lower than the impurity concentration of the p⁻-type base regions 2 of the IGBT region 31 by introducing the hydrogen ions at a high concentration in the p⁻-type base regions 2', the diffusion depth from the front surface 10a of the semiconductor substrate 10 is shallow only for the p⁻-type base regions 2' of the FWD region 32.

As described above, according to the fourth embodiment, effects similar to those of the first embodiment may be obtained. Further, according to the fourth embodiment, hydrogen ions are introduced at a high concentration in the p⁻-type base regions, whereby crystal defects in the p⁻-type base regions may be recovered.

In the foregoing, the present invention is not limited to the embodiments described above and various modifications within a range not departing from the spirit of the invention are possible. For example, the method of fabrication (manufacturing) is not limited to the example given in the first embodiment. For example, a sequence of the processes may be interchanged, for example, steps S6, S7 may be performed after step S8, or steps S2, S3, or step S8 may be performed after steps S6, S7. Alternatively, the donor treatment at step S7 may also be performed by the heating at the time of soldering to the circuit board instead of by a wafer process. Alternatively, the proton irradiation of the n⁺-type buffer region 23 at step S5 may be performed concurrently with the proton irradiation at step S6 or after step S6, and the donor treatment of the n⁺-type buffer region 23 may be performed concurrently with the donor treatment at step S7.

Further, for example, in the embodiments described above, while an instance in which the hydrogen ion irradiation is performed to an entire surface (i.e., an entire area of the active region and edge termination region) of the semiconductor substrate is described as an example, the hydrogen ion irradiation may be performed via a mask covering predetermined regions, whereby the storage regions 21 and the crystal defect region may be selectively formed. Further, in the embodiments described above, while a RC-IGBT is described as an example, the present invention is further applicable to a single IGBT and a single diode and has similar effects.

The semiconductor device and the method of manufacturing a semiconductor device according to the invention achieve an effect in that a semiconductor device having storage regions and a carrier lifetime killer region may be provided.

As described, the semiconductor device and the method of manufacturing a semiconductor device according to the present invention is useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate having a front surface and a back surface opposite to each other:
a plurality of hydrogen donors provided in the semiconductor substrate and having a first doping concentration higher than a second doping concentration of a dopant of the semiconductor substrate, the hydrogen donors having a doping concentration distribution that has a peak at a first depth position apart from the front surface of the semiconductor substrate by a predetermined distance in a depth direction of the semiconductor substrate and a tail where the first doping concentration is lower than at the peak, a position of the tail being closer to the back surface of the semiconductor substrate than is the first depth position; and
a crystal defect region containing crystal defects, the crystal defect region having a second depth position where a density of the crystal defects toward the front surface of the semiconductor substrate in the depth direction is greatest, the second depth position being closer to the back surface of the semiconductor substrate in the depth direction of the semiconductor substrate than is the first depth position.

2. The semiconductor device according to claim 1, wherein
a hydrogen concentration distribution of the hydrogen donors in the depth direction has:
a first tail closer to the second main surface than is the first depth position, the first tail indicating a hydrogen concentration that decreases from the first depth position toward the second main surface, and
a second tail closer to the first main surface than is the first depth position, the second tail indicating the hydrogen concentration is more steeply decreasing from the first depth position toward the first main surface than is the hydrogen concentration of the first tail from the first depth position toward the second main surface, and
the crystal defect region has a crystal defect density distribution in which the density of the crystal defects decreases gradually and monotonically from the second depth position toward the second main surface.

3. The semiconductor device according to claim 1, wherein
the first doping concentration includes an n-type impurity concentration of the n-type impurity of the hydrogen donors other than hydrogen and a hydrogen concentration of hydrogen, and
an n-type impurity concentration distribution of the n-type impurity of the hydrogen donors other than hydrogen has a peak impurity position in the depth direction that is different from a peak impurity position of a hydrogen concentration distribution of the hydrogen donors.

4. The semiconductor device according to claim 1, wherein
the first doping concentration includes an n-type impurity concentration of the n-type impurity of the hydrogen donors other than hydrogen and a hydrogen concentration of hydrogen, and
an n-type impurity concentration distribution of the n-type impurity of the hydrogen donors other than hydrogen has a peak value lower than a peak value of a hydrogen concentration distribution of the hydrogen donors.

5. The semiconductor device according to claim 1, further comprising:
a first device element region in which an insulated gate bipolar transistor is disposed; and
a second device element region adjacent to the first device element region and in which a diode connected in antiparallel to the insulated gate bipolar transistor is disposed, wherein
the crystal defect region is provided in an entire area of the first device element region and an entire area of the second device element region.

6. The semiconductor device according to claim 5, wherein
the diode includes a plurality of p-type anode regions and the insulated gate bipolar transistor includes a plurality of p-type base regions, the p-type anode regions having an impurity concentration lower than an impurity concentration of the p-type base regions.

7. The semiconductor device according to claim 5, wherein
the crystal defect region is provided continuously across the first device element region, from the second device element region.

8. The semiconductor device according to claim 1, wherein
the hydrogen donors include hydrogen and an n-type impurity other than hydrogen.

9. The semiconductor device according to claim 1, wherein
a width of the crystal defect density distribution in the depth direction of the crystal defect region is greater than a width of the hydrogen concentration distribution in the depth direction of the peak of the doping concentration distribution of the hydrogen donors.

10. A semiconductor device, comprising:
a semiconductor substrate having a first device element region in which a first device element is disposed and a second device element region in which a second device element is disposed, the second device element region being adjacent to the first device element region and the semiconductor substrate having a front surface and a back surface that are opposite to each other;
a first semiconductor region of a first conductivity type, provided in the semiconductor substrate;
a plurality of second semiconductor regions of a second conductivity type, provided in the semiconductor substrate closer to the front surface of the semiconductor substrate than is the first semiconductor region;
a third semiconductor region provided in the semiconductor substrate, closer to the back surface of the semiconductor substrate than is the first semiconductor region, the third semiconductor region having an impurity concentration higher than an impurity concentration of the first semiconductor region;
a plurality of fourth semiconductor regions of the first conductivity type, selectively provided in the semiconductor substrate, closer to the back surface of the semiconductor substrate than are the second semiconductor regions, the fourth semiconductor regions being in contact with the first semiconductor region in a direction parallel to the front surface of the semiconductor substrate, the fourth semiconductor regions each having an impurity concentration higher than the impurity concentration of the first semiconductor region and each including a first depth position;

a crystal defect region containing crystal defects, provided between the back surface of the semiconductor substrate and the fourth semiconductor regions, the crystal defect region having therein a second depth position where a density of the crystal defects in the semiconductor substrate has a maximum value;

a first electrode provided on the front surface of the semiconductor substrate and electrically connected to the second semiconductor regions; and a second electrode provided on the back surface of the semiconductor substrate and electrically connected to the third semiconductor region, wherein the fourth semiconductor regions each contain hydrogen atoms as an impurity, and are disposed in regions each including therein the first depth position where a hydrogen concentration toward the front surface of the semiconductor substrate is greatest, the hydrogen concentration distribution of the fourth semiconductor regions in the depth direction has:
 a first tail closer to the back surface than is the first depth position, the first tail indicating a hydrogen concentration that decreases from the first depth position toward the back surface, and
 a second tail closer to the front surface than is the first depth position, the second tail indicating the hydrogen concentration is more steeply decreasing from the first depth position toward the front surface than is the hydrogen concentration of the first tail from the first depth position toward the back surface, the crystal defect region has a crystal defect density distribution in which the density of the crystal defects decreases gradually and monotonically from the second depth position toward the back surface, and the density of crystal defects in the semiconductor substrate is greatest in the crystal defect region.

11. The semiconductor device according to claim 10, wherein
a peak impurity position in an n-type impurity concentration distribution of the n-type impurity of the fourth semiconductor regions other than hydrogen is different from a peak impurity position in a hydrogen concentration distribution of the fourth semiconductor regions.

12. The semiconductor device according to claim 10, wherein
a peak value of an n-type impurity concentration distribution of the n-type impurity of the fourth semiconductor regions other than hydrogen is lower than a peak value of a hydrogen concentration distribution of the fourth semiconductor regions.

13. The semiconductor device according to claim 10, wherein
the third semiconductor region has a first portion of the second conductivity type in the first device element region and a second portion of the first conductivity type in the second device element region,
the first device element is an insulated gate bipolar transistor having the first semiconductor region as a drift region, the second semiconductor regions as base regions, a plurality of fifth semiconductor regions of the first conductivity type, selectively provided in the second semiconductor regions, and the first portion of the third semiconductor region in the first device element region as a collector region, and
the second device element is a diode connected in anti-parallel to the insulated gate bipolar transistor and having the first semiconductor region as a drift region, the second semiconductor regions as anode regions, and the second portion of third semiconductor region in the second device element region as a cathode region.

14. The semiconductor device according to claim 13, further comprising:
a plurality of trenches extending in a depth direction from the front surface of the semiconductor substrate and reaching the first semiconductor region or the fourth semiconductor regions, each of the trenches having sidewalls in contact with the second semiconductor regions; and
a plurality of third electrodes respectively provided in the trenches via an insulating film.

15. The semiconductor device according to claim 14, wherein
the fourth semiconductor regions each reaches a corresponding one of the trenches in a direction parallel to the front surface of the semiconductor substrate.

16. The semiconductor device according to claim 14, wherein
each of the trenches in the first device element region extends in the depth direction from the front surface of the semiconductor substrate and reaches the first semiconductor region, each of the sidewalls thereof being in contact with one of the fifth semiconductor regions and one of the second semiconductor regions, and
the first electrode is electrically connected to the fifth semiconductor regions, the second semiconductor regions, and the third electrodes in the trenches of the second device element region.

17. The semiconductor device according to claim 13, wherein
the crystal defect region is provided in an entire area of the first device element region and an entire area of the second device element region.

18. The semiconductor device according to claim 17, wherein
the anode regions of the diode and the base regions of the insulated gate bipolar transistor are each a p-type, the anode regions of the diode having an impurity concentration that is lower than an impurity concentration of the base regions of the insulated gate bipolar transistor.

19. The semiconductor device according to claim 10, wherein
the fourth semiconductor regions are in contact with the second semiconductor regions.

20. The semiconductor device according to claim 10, further comprising
a buffer region of the first conductivity type, disposed at a position between the third semiconductor region and the first depth position, the buffer region having an impurity concentration higher than the impurity concentration of the first semiconductor region.

21. The semiconductor device according to claim 10, wherein
the fourth semiconductor regions contain an n-type impurity other than hydrogen.

22. A method of manufacturing a semiconductor device, the method comprising:
injecting hydrogen ions from a back surface of a semiconductor substrate in a depth direction of the semiconductor substrate in a first hydrogen ion implantation process, crystal defects being formed by the first hydrogen ion implantation process; and reducing, in a region including a first depth position where the hydrogen ions have a maximum concentration, the crystal defects generated through the first hydrogen ion implantation process, through an annealing treatment performed on the semiconductor substrate at a first temperature in a first annealing process, thereby forming a region including a second depth position where a density of the crystal defects becomes greatest, the second depth position being closer to the back surface of the semiconductor substrate than is the first depth position.

23. The method according to claim 22, further comprising injecting hydrogen ions from the back surface of the semiconductor substrate in a second hydrogen ion implantation process, before the first hydrogen ion implantation process, the hydrogen ions being injected in a region farther from the back surface of the semiconductor substrate in the depth direction than is the region including the first depth position.

24. The method according to claim 23, wherein the second hydrogen ion implantation process includes injecting the hydrogen ions a plurality of times so that respective positions of peaks of a concentration distribution of the hydrogen ions differ.

25. The method according to claim 23, further comprising performing an annealing treatment at a temperature at least equal to the first temperature in a second annealing process, after the second hydrogen ion implantation process but before the first hydrogen ion implantation process.

26. The method according to claim 22, further comprising after the first annealing process:
forming the semiconductor substrate into chips; and
soldering the chips to a circuit board by a temperature lower than the first temperature in a soldering process.

27. A method of manufacturing a semiconductor device having:
a first semiconductor region of a first conductivity type provided in a semiconductor substrate having a front surface and a back surface that are opposite to each other,
a plurality of second semiconductor regions of a second conductivity type provided in the semiconductor substrate, closer to the front surface of the semiconductor substrate than is the first semiconductor region,
a third semiconductor region provided in the semiconductor substrate, closer to the back surface of the semiconductor substrate than is the first semiconductor region and having an impurity concentration higher than an impurity concentration of the first semiconductor region,
a plurality of fourth semiconductor regions of the first conductivity type, selectively provided in the semiconductor substrate, closer to the back surface of the semiconductor substrate than are the second semiconductor regions and in contact with the first semiconductor region in a direction parallel to the front surface of the semiconductor substrate, the fourth semiconductor regions having an impurity concentration higher than the impurity concentration of the first semiconductor region and containing hydrogen atoms as an impurity, the fourth semiconductor regions being disposed in a region including a first depth position where a hydrogen concentration in the semiconductor substrate toward the front surface thereof is greatest,
a crystal defect region containing crystal defects, the crystal defect region being provided between the back surface of the semiconductor substrate and the fourth semiconductor regions, the crystal defect region having a second depth position where a density of the crystal defects exhibits a maximum value,
a first electrode electrically connected to the second semiconductor regions, and
a second electrode electrically connected to the third semiconductor region, the method comprising:
forming the second semiconductor regions in the semiconductor substrate at the front surface of the semiconductor substrate;
forming the first electrode electrically connected to the second semiconductor regions, at the front surface of the semiconductor substrate;
forming the third semiconductor region in the semiconductor substrate at the back surface thereof;
ion-irradiating hydrogen atoms by an ion-irradiation performed in a planer region that is parallel to the front surface of the semiconductor substrate, that includes the first depth position in a depth direction, and that is closer to the back surface of the semiconductor substrate than are the second semiconductor regions, the hydrogen atoms being ion-irradiated from the back surface of the semiconductor substrate;
converting the ion-irradiated hydrogen atoms into donors through a heat treatment, and forming the fourth semiconductor regions of the first conductivity type in the region that includes the first depth position, the fourth semiconductor regions being in contact with the first semiconductor region and containing the hydrogen atoms as an impurity, the impurity concentration of the fourth semiconductor regions being higher than that of the first semiconductor region; and
forming, on the back surface of the semiconductor substrate, the second electrode electrically connected to the third semiconductor region, wherein
a plurality of crystal defects is formed in a passage region of the hydrogen atoms by the ion-irradiation, and
the crystal defect region having the second depth position where the density of the crystal defects is greatest is formed when the ion-irradiated hydrogen atoms are converted into donors and the fourth semiconductor regions are formed.

28. The method according to claim 27, the semiconductor device further including:
a plurality of trenches extending in the depth direction from the front surface of the semiconductor substrate and reaching the first semiconductor region or the fourth semiconductor regions, each of the trenches having sidewalls each in contact with a corresponding one of the second semiconductor regions, and
a plurality of third electrodes respectively provided in the trenches via an insulating film, wherein
the trenches, the insulating films, and the third electrodes are formed when the second semiconductor regions are formed.

29. The method according to claim 28, wherein the fourth semiconductor regions are each formed reaching a corresponding one of the trenches in a direction parallel to the front surface of the semiconductor substrate.

30. The method according to claim 28, the semiconductor device further including a plurality of fifth semiconductor regions of the first conductivity type, selectively provided in the second semiconductor regions, wherein the third semiconductor region is of the second conductivity type, the trenches each extend in the depth direction from the front surface of the semiconductor substrate and reach the first semiconductor region, each of the sidewalls thereof is in contact with one of the fifth semiconductor regions and one of the second semiconductor regions, the first electrode is electrically connected to the fifth semiconductor regions and the second semiconductor regions, and the fifth semiconductor regions are formed when the second semiconductor regions are formed.

31. The method according to claim 28, wherein
the third semiconductor region is of the first conductivity type, and
the third electrodes are electrically connected to the first electrode.

32. The method according to claim 27, wherein
the fourth semiconductor regions are each formed in contact with a corresponding one of the second semiconductor regions.

33. The method according to claim 27, wherein
a buffer region of the first conductivity type is formed between the third semiconductor region and the first depth position, the buffer region having an impurity concentration higher than the impurity concentration of the first semiconductor region.

* * * * *